(12) United States Patent
Saito et al.

(10) Patent No.: US 9,449,929 B2
(45) Date of Patent: *Sep. 20, 2016

(54) SEMICONDUCTOR DEVICE AND LAYOUT DESIGN SYSTEM

(71) Applicant: RENESAS ELECTRONICS CORPORATION, Kawasaki-shi, Kanagawa (JP)

(72) Inventors: Takumi Saito, Yokohama (JP); Masayuki Hiroi, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/792,285

(22) Filed: Jul. 6, 2015

(65) Prior Publication Data

US 2015/0311166 A1    Oct. 29, 2015

Related U.S. Application Data

(63) Continuation of application No. 14/204,733, filed on Mar. 11, 2014, now Pat. No. 9,111,063.

(30) Foreign Application Priority Data

Mar. 12, 2013  (JP) .................................. 2013-049046

(51) Int. Cl.
*H01L 23/544*  (2006.01)
*H01L 23/00*  (2006.01)
(Continued)

(52) U.S. Cl.
CPC ......... *H01L 23/564* (2013.01); *G06F 17/5068* (2013.01); *G06F 17/5072* (2013.01); *H01L 23/5226* (2013.01); *H01L 23/585* (2013.01); *H01L 2924/0002* (2013.01)

(58) Field of Classification Search
CPC . H01L 23/585; H01L 23/5225; H01L 23/58; H01L 21/4814; H01L 23/10
See application file for complete search history.

(56) References Cited

U.S. PATENT DOCUMENTS 6,078,085 A    6/2000  Suzuki
7,138,700 B2  11/2006  Tomita et al.
(Continued)

FOREIGN PATENT DOCUMENTS

JP    11145308 A    5/1999
JP    2004-304124 A   10/2004
(Continued)

OTHER PUBLICATIONS

Notice of Allowance U.S. Appl. No. 14/204,733 dated Apr. 20, 2015.

(Continued)

*Primary Examiner* — Jarrett Stark
(74) *Attorney, Agent, or Firm* — McDermott Will & Emery LLP

(57) ABSTRACT

In a semiconductor device including a seal ring area containing multiple seal rings are coupled to each other at equal intervals via bridge patterns, improper local relocation of bridge patterns may reduce the reliability of the semiconductor device. A semiconductor device has a first group containing a predetermined number of the bridge patterns spaced at a first interval and a second group containing a predetermined number of the bridge patterns spaced at the first interval, the second group being located at a second interval from the first group. The second interval is larger than the first interval.

10 Claims, 23 Drawing Sheets

(51) Int. Cl.
*G06F 17/50* (2006.01)
*H01L 23/58* (2006.01)
*H01L 23/522* (2006.01)

(56) References Cited

U.S. PATENT DOCUMENTS

| | | | |
|---|---|---|---|
| 7,199,042 | B2 | 4/2007 | Ozawa |
| 7,663,240 | B2 | 2/2010 | Hiroi |
| 7,675,143 | B2 | 3/2010 | Kadoyama et al. |
| 8,330,254 | B2 | 12/2012 | Furumiya et al. |
| 8,530,997 | B1 | 9/2013 | Yang et al. |
| 2004/0150070 | A1 | 8/2004 | Okada et al. |
| 2005/0087878 | A1 | 4/2005 | Uesugi et al. |
| 2005/0280120 | A1 | 12/2005 | Tomita |
| 2006/0055007 | A1 | 3/2006 | Yao et al. |
| 2008/0251923 | A1 | 10/2008 | Wang et al. |
| 2009/0294929 | A1 | 12/2009 | Lee et al. |
| 2010/0084751 | A1 | 4/2010 | Frederick, Jr. et al. |
| 2011/0241164 | A1 | 10/2011 | Nakamura |
| 2012/0139101 | A1 | 6/2012 | Shimada et al. |
| 2012/0305916 | A1 | 12/2012 | Liu et al. |

FOREIGN PATENT DOCUMENTS

| | | | |
|---|---|---|---|
| JP | 2005-129717 | A | 5/2005 |
| JP | 2005-142351 | A | 6/2005 |
| JP | 2006-005288 | A | 1/2006 |
| JP | 2006210648 | A | 8/2006 |
| JP | 2006-351878 | A | 12/2006 |
| JP | 2011-197811 | A | 10/2011 |
| JP | 2011-216648 | A | 10/2011 |
| JP | 2012-212697 | A | 11/2012 |

OTHER PUBLICATIONS

Non-Final Office Action U.S. Appl. No. 14/204,733 dated Feb. 26, 2015.

Office Action issued in corresponding Japanese Patent Application No. 2013-049046 dated May 10, 2016; 13 pgs with English translation.

Notification of Reasons for Refusal Japanese Patent Application No. 2013-049046 dated May 10, 2016 with English translation.

Notification of Reasons for Refusal Japanese Patent Application No. 2013-049046 dated Jul. 12, 2006 with English translation.

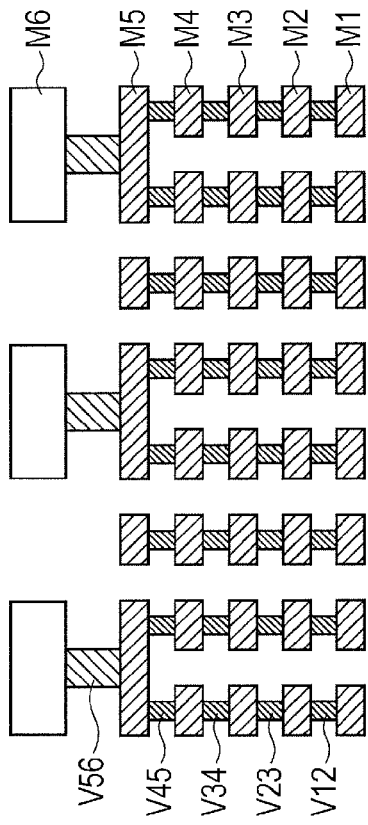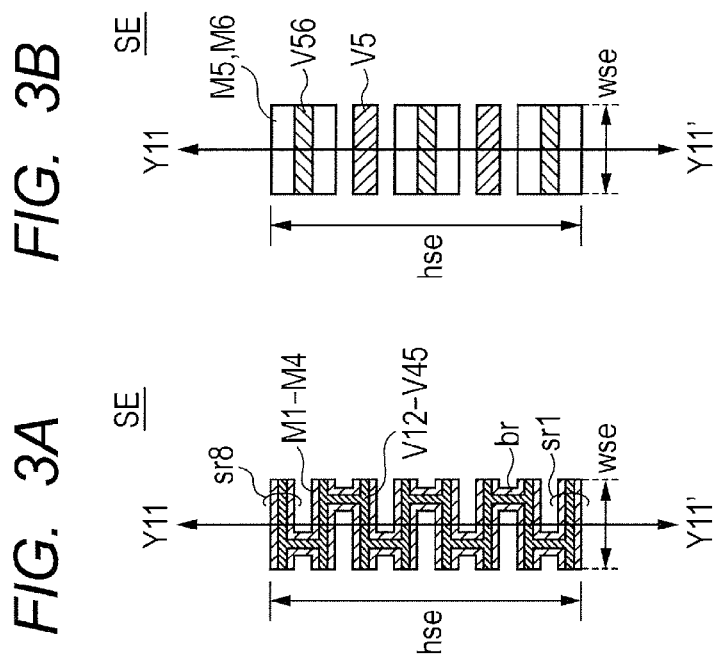

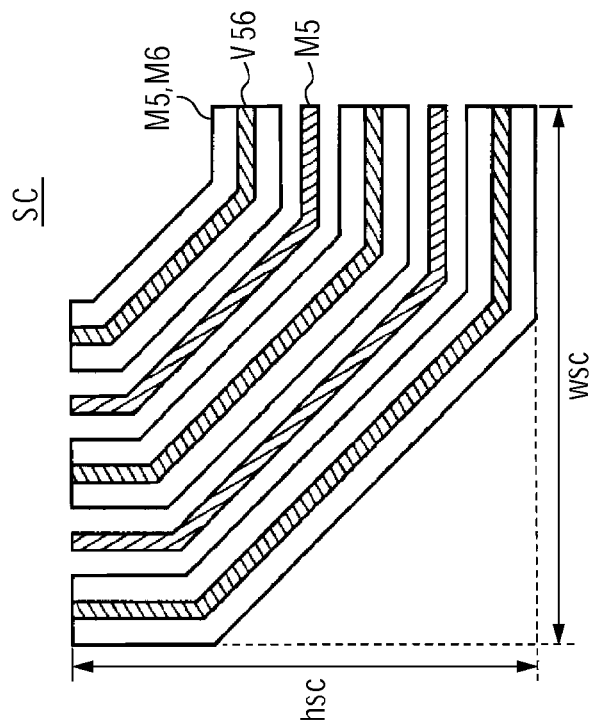
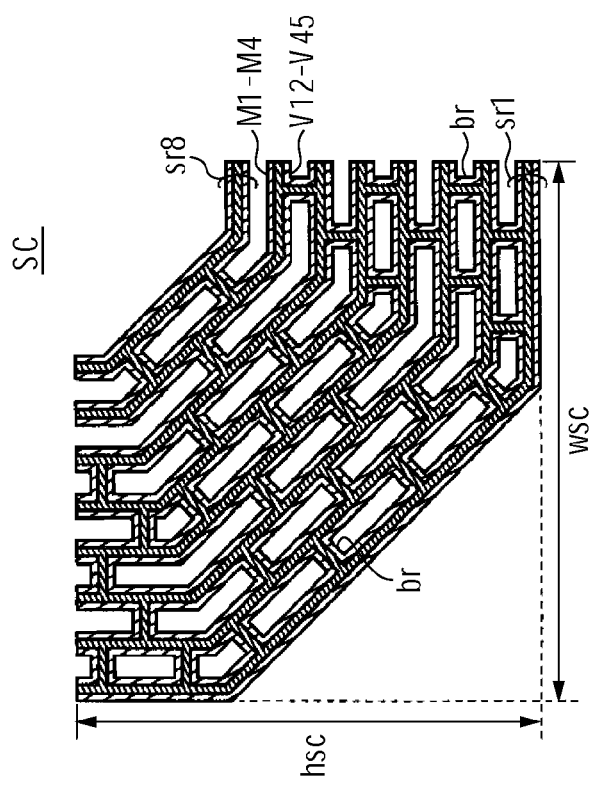

(X11-X11' CROSS-SECTIONAL VIEW)

(X21-X21' CROSS-SECTIONAL VIEW)

S9 (PLACE FIRST/SECOND SEAL RING EDGE CELL GROUPS Gse1/Gse2 NEXT TO SEAL RING CORNER CELLS SC)

S9 (PLACE BRIDGE INTERVAL ADJUSTING CELL GROUP Gsf BETWEEN FIRST/SECOND SEAL RING EDGE CELL GROUPS Gse1/Gse2)

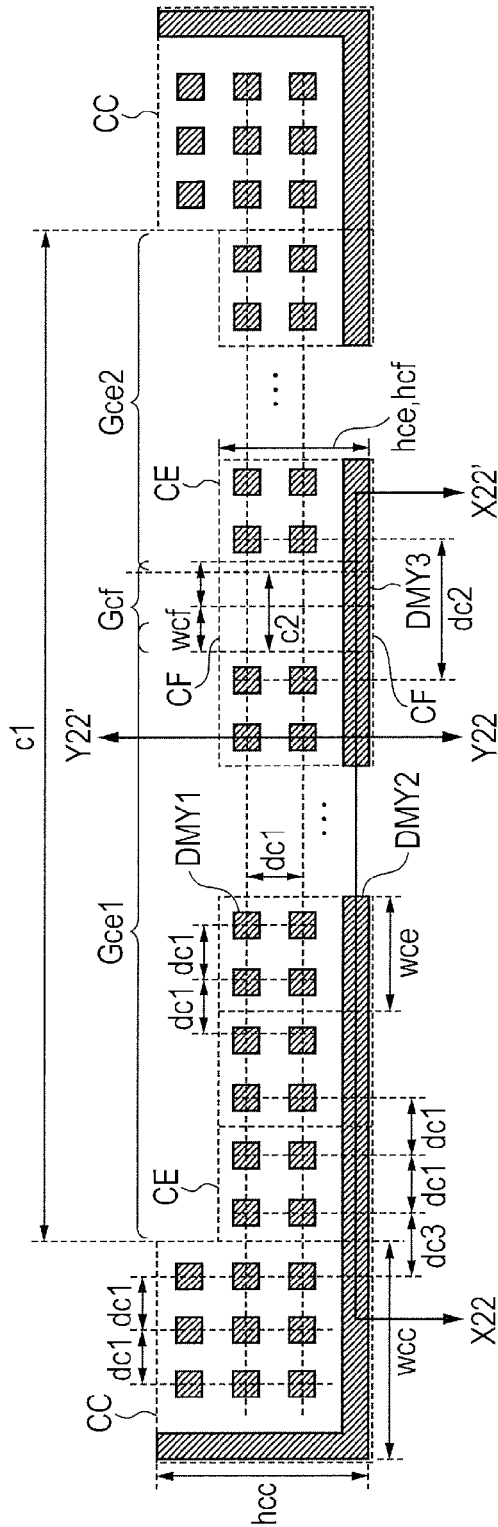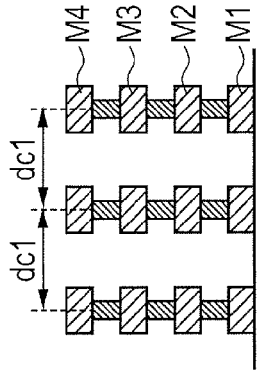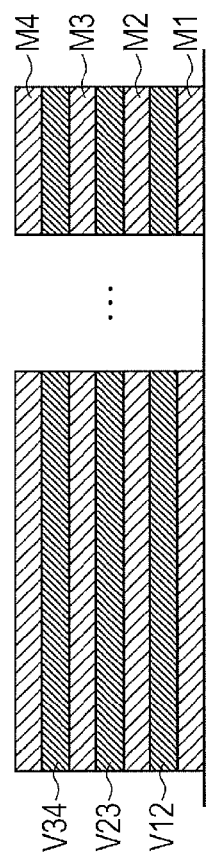
FIG. 21A
FIG. 21B (X22-X22' CROSS-SECTIONAL VIEW)
FIG. 21C (Y22-Y22' CROSS-SECTIONAL VIEW)

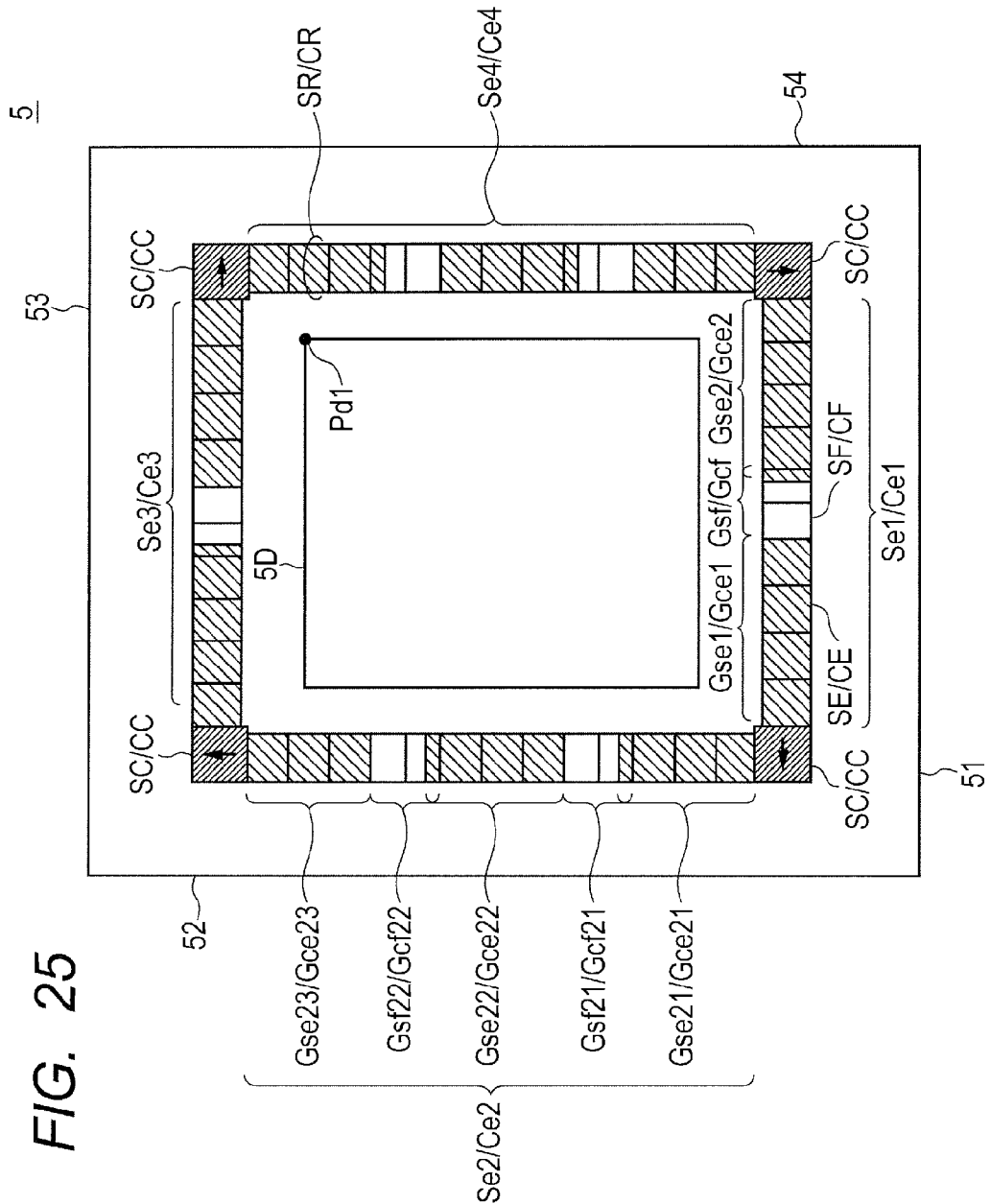

SEMICONDUCTOR DEVICE AND LAYOUT DESIGN SYSTEM

CROSS-REFERENCE TO RELATED APPLICATIONS

This Application is a Continuation Application of U.S. Ser. No. 14/204,733 filed Mar. 11, 2014, which claims priority to Japanese Patent Application No. 2013-049046 filed on Mar. 12, 2013. The subject matter of each is incorporated herein by reference in entirety.

BACKGROUND

The present invention relates to a semiconductor device having a protected area, and a layout design system.

Moisture entry or the like from a dicing surface of a semiconductor device (hereinafter, may be called a semiconductor chip) may adversely affect circuit elements and a wiring layer on a semiconductor chip. Such moisture entry frequently occurs on a semiconductor chip including an interlayer insulating layer made of a low-dielectric constant insulating material. Furthermore, the circuit elements and wiring on the semiconductor chip may be broken by cracks appearing on the interlayer insulating layer during dicing or resin molding on the semiconductor chip.

Japanese Unexamined Patent Publication No. 2006-210648 discloses a semiconductor device that includes an element formation area overlying a semiconductor substrate and a seal ring area formed around the element formation area. The seal ring area includes a wiring layer having wiring and a via layer having rows of slit vias.

As is disclosed in Japanese Unexamined Patent Publication No. 2006-210648, a typical seal ring area formed around an element formation area as a protected area of the element formation area includes multiple seal rings including slit vias and wiring layers. The multiple seal rings can suppress moisture entry into the element formation area and the occurrence of cracks on an interlayer insulating layer with higher reliability.

The multiple seal rings each have multiple bridge patterns formed perpendicularly to the extending direction of the slit via and the wiring layer. Like the seal ring, the bridge pattern is configured by slit vias and a wiring layer. The slit vias and the wiring layer of the bridge pattern couple the slit vias and the wiring layer of the seal ring. The slit vias and the wiring layer are opposed to each other inside and outside of the seal ring. The seal rings coupled by the bridge patterns increase the mechanical strength of the seal ring area.

SUMMARY

The layout design of the seal ring area is obtained by combining some pieces of basic cell data according to a design rule. A predetermined number of basic cells including bridge patterns are disposed with a predetermined pitch, forming the bridge patterns between the seal rings on a semiconductor chip. The element formation area and the seal ring area vary in size among semiconductor chips even in a design made under the same design rule. If the bridge patterns cannot be evenly spaced at equal intervals when the size of the semiconductor chip is changed, a distance between the bridge patterns needs to be locally changed. This change is adjusted by locally changing an interval between the basic cells containing the bridge patterns.

If the basic cells containing the bridge patterns are locally relocated in an unsuitable manner, the mechanical strength of the seal ring area decreases. This may reduce the reliability of the semiconductor chip. Other problems and new features will be clarified with reference to the description and the accompanying drawings of the present specification.

According to an embodiment, a semiconductor device includes a circuit design area formed over a semiconductor substrate and a seal ring area disposed around the circuit design area. The seal ring area has a first seal ring corner cell and a second seal ring corner cell, a first seal ring and a second seal ring that are coupled to the respective first and second seal ring corner cells, and multiple first bridge patterns coupled to the first and the second seal rings. The first bridge patterns have a first group and a second group, the first group being adjacent to the first seal ring corner cell and including a predetermined number of first bridge patterns spaced at a first interval, and the second group being located at a second interval from the first group and including a predetermined number of first bridge patterns spaced at the first interval. The second interval is larger than the first interval.

According to the embodiment, the location of the bridge pattern coupled to the seal ring is adjusted around a chip and near the center of the chip, completing the semiconductor device while keeping the mechanical strength of the seal ring area.

BRIEF DESCRIPTION OF THE DRAWINGS

FIGS. 3A to 3C are plan views and a cross-sectional view showing seal ring edge cells provided in the semiconductor device according to the first embodiment;

FIGS. 5A and 5B are plan views of a seal ring corner cell provided in the semiconductor device according to the first embodiment;

FIGS. 21A to 21C are a plan view and cross-sectional views of a crack extension preventing area provided in the semiconductor device of FIG. 20;

FIG. 25 is a schematic diagram of a semiconductor device according to a fifth embodiment.

DETAILED DESCRIPTION

Figure 1:
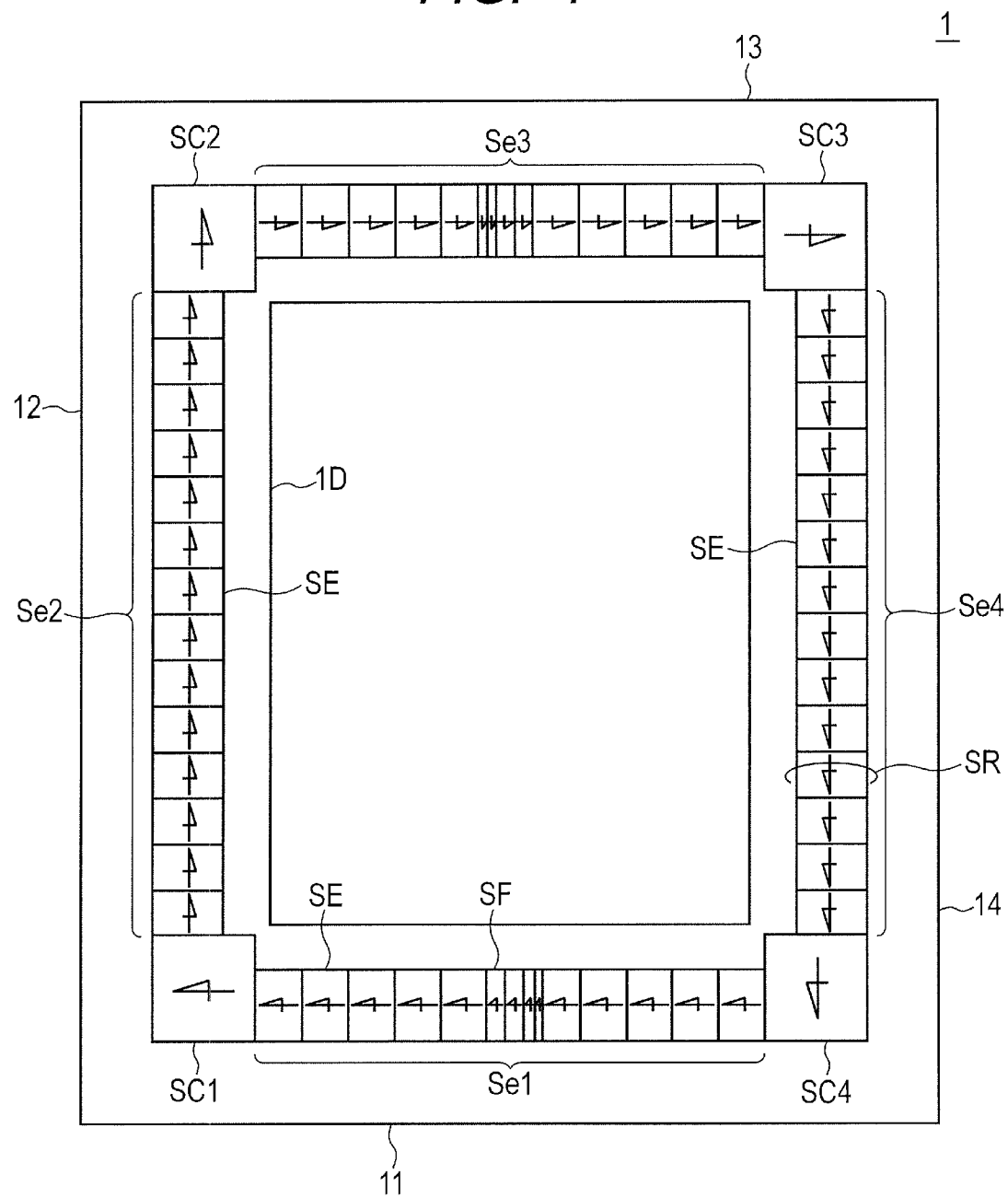
FIG. 1 is a schematic diagram of a semiconductor device according to a first embodiment.

Embodiments will be described below with reference to the accompanying drawings. The present invention is not always limited to a number and an amount described in the embodiments unless otherwise specified. In the drawings of the embodiments, the same reference characters and reference numbers indicate the same parts or equivalent parts. In the description of the embodiments, the parts indicated by the same reference characters may not be repeatedly explained.

<Semiconductor Device According to First Embodiment>

Referring to FIG. 1, the configuration of a semiconductor device 1 according to the first embodiment will be described below.

In the following explanation, an interval between bridge patterns br indicates a center distance between the bridge patterns br unless otherwise specified.

The semiconductor device 1 includes a circuit design area 1D, a seal ring area SR, and chip peripheral parts 11, 12, 13, and 14 (hereinafter, will be called chip peripheral parts 11 to 14 also in other configuration requirements). The circuit design area 1D includes various functional blocks, an input/output part, and bonding pads. The seal ring area SR includes seal ring corner cells SC1 to SC4 and seal ring edges Se1 to Se4. The chip peripheral parts 11 to 14 indicate the cut sides of the semiconductor device 1 that is cut by dicing.

The seal ring corner cells SC1 to SC4 are identical in structure and are oriented in different directions depending upon the locations of the seal ring corner cells. For example, if the seal ring corner cell SC1 is disposed on the lower left corner of the semiconductor device 1, the seal ring corner cells SC2 to SC4 are sequentially rotated clockwise by 90° from the orientation of the seal ring corner cell SC1. In FIG. 1, arrows at the central parts of rectangles, which represent the seal ring corner cells SC1 to SC4, indicate the orientations of the seal ring corner cells SC1 to SC4. In the present specification, layout data on the seal ring corner cell SC1 serving as a basic cell is denoted as a seal ring corner cell SC.

The seal ring edge Se1 in the seal ring area SR includes multiple seal ring edge cells SE disposed between the seal ring corner cell SC1 and the seal ring corner cell SC4 and at least one bridge interval adjusting cell SF.

The seal ring edge Se2 in the seal ring area SR includes multiple seal ring edge cells SE disposed between the seal ring corner cell SC1 and the seal ring corner cell SC2.

The seal ring edge Se3 in the seal ring area SR includes multiple seal ring edge cells SE disposed between the seal ring corner cell SC2 and the seal ring corner cell SC3 and at least one bridge interval adjusting cell SF.

The seal ring edge Se4 in the seal ring area SR includes multiple seal ring edge cells SE disposed between the seal ring corner cell SC3 and the seal ring corner cell SC4. The number of seal ring edge cells SE and the number of bridge interval adjusting cells SF in the seal ring edges Se1 to Se4 are optionally set depending upon the size and design rule of the semiconductor device 1.

The seal ring edge cells SE and the bridge interval adjusting cells SF on the seal ring edges Se1 to Se4 are oriented in different directions for the respective seal ring edges Se1 to Se4. For example, the orientation of the seal ring edge cell SE on the seal ring edge Set is rotated clockwise by 90° from that of the seal ring edge cell SE on the seal ring edge Se1. The rotation angles of the seal ring edge cells SE or the bridge interval adjusting cells SF on the seal ring edges Se3 and Se4 are set as on the seal ring edge Se2.

Figure 2:
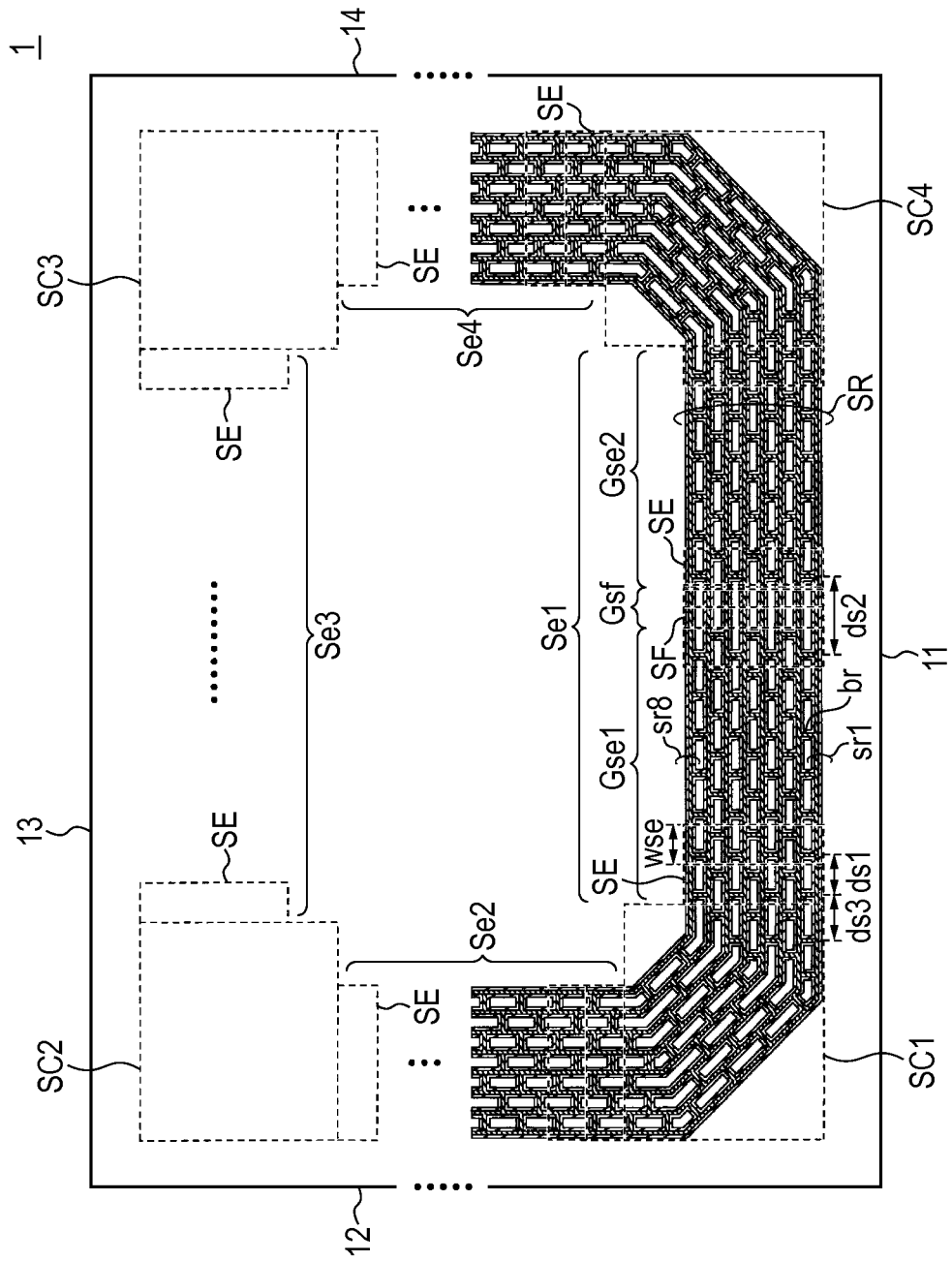
FIG. 2 is a plan view of a seal ring area provided in the semiconductor device according to the first embodiment.

Referring to FIG. 2, a plan view of the seal ring area SR provided in the semiconductor device 1 according to the first embodiment will be discussed below.

As described above, the seal ring area SR includes the seal ring corner cells SC1 to SC4 and the seal ring edges Se1 to Se4. As shown in FIG. 2, the seal ring edge Se1 includes a first seal ring edge cell group Gse1, a second seal ring edge cell group Gse2, and a bridge interval adjusting cell group Gsf. As will be described later, the seal ring area SR includes multiple wiring layers and vias that couple the different wiring layers. FIG. 2 shows a plan view pattern of one of the wiring layers and the vias coupled to the wiring layer.

The first seal ring edge cell group Gse1 is disposed adjacent to the seal ring corner cell SC1. The first seal ring edge cell group Gse1 includes the seal ring edge cells SE that are disposed adjacent to each other along the chip peripheral part 11. The seal ring edge cell SE disposed on the left end of the first seal ring edge cell group Gse1 is disposed adjacent to the seal ring corner cell SC1.

The second seal ring edge cell group Gse2 is disposed adjacent to the seal ring corner cell SC4. The second seal ring edge cell group Gse2 includes the seal ring edge cells SE that are disposed adjacent to each other along the chip peripheral part 11. The seal ring edge cell SE disposed on the right end of the second seal ring edge cell group Gse2 is disposed adjacent to the seal ring corner cell SC4.

The bridge interval adjusting cell group Gsf is disposed between the seal ring edge cell SE disposed on the right end of the first seal ring edge cell group Gse1 and the seal ring edge cell SE disposed on the left end of the second seal ring edge cell group Gse2. The bridge interval adjusting cell group Gsf includes at least one of the bridge interval adjusting cells SF.

The bridge interval adjusting cells SF are disposed with a predetermined pitch between the first seal ring edge cell group Gse1 and the second seal ring edge cell group Gse2. In this case, one of the bridge interval adjusting cells SF may partially overlie the seal ring edge cell SE. "Overlie" means placement over layout data. A wiring pattern or the like in the semiconductor device 1 is formed by performing an OR on the corresponding layout data.

The seal ring area SR includes eight seal rings sr1 to sr8 around the circuit design area 1D. The seal rings sr1 to sr8 are coupled to one another via the bridge patterns br. Consequently, in the seal ring area SR, areas interposed between the seal rings sr1 to sr8 are divided into small areas by the bridge patterns br. This structure contributes to higher mechanical strength and higher moisture resistance of the seal ring area SR.

The need for local relocation of the bridge patterns br will be described below.

The bridge interval adjusting cell group Gsf is disposed between the first seal ring edge cell group Gse1 and the second seal ring edge cell group Gse2. If the length of the seal ring edge Se1 is an integral multiple of a width wse of the seal ring edge cell SE, the seal ring edge Se1 only includes the seal ring edge cells SE. In this case, the bridge patterns br in the seal ring edge Se1 are evenly spaced at a predetermined interval that satisfies the design rule.

If the length of the seal ring edge Se1 is not an integral multiple of the width wse of the seal ring edge cell SE, the bridge patterns br cannot be locally disposed. The bridge interval adjusting cell group Gsf corresponds to an area where the bridge patterns br cannot be disposed.

The bridge patterns br cannot be disposed because the placement of the bridge patterns br violates the design rule of the semiconductor device 1. Specifically, the wiring layers and vias of the adjacent bridge patterns br are spaced with an interval smaller than a minimum value specified by the design rule. Thus, the bridge interval adjusting cells SF disposed in the bridge interval adjusting cell group Gsf do not have the bridge patterns br but only have patterns of parts of the seal rings sr1 to sr8.

Near the area of the bridge interval adjusting cells SF, the bridge patterns br are spaced with a larger interval than in other parts. This reduces the mechanical strength of the seal ring area SR.

The seal rings sr1 to sr8 near the corners of the semiconductor device 1 are susceptible to a stress caused by dicing or resin molding. Thus, the bridge patterns br added to the seal rings sr1 to sr8 on and around the corners are desirably spaced equally with a minimum interval under the design rule. The seal rings sr1 to sr8 around the center of, for example, the chip peripheral part 11 of the semiconductor device 1 are less susceptible to a stress caused by dicing or resin molding than in the vicinity of the corners of the semiconductor device 1. Thus, the bridge interval adjusting cells SF are desirably placed near the center of, for example, the chip peripheral part 11.

The interval between the locally relocated bridge patterns br will be discussed below.

Of the bridge patterns br contained in the seal ring area SR, the pitch of the bridge patterns br disposed in an area corresponding to the first seal ring edge cell group Gse1 is equal to the width wse of the seal ring edge cell SE, that is, the pitch of the disposed seal ring edge cells SE. Likewise, the pitch of the bridge patterns br disposed in an area corresponding to the second seal ring edge cell group Gse2 is set at the width wse.

The bridge interval adjusting cell group Gsf has the bridge interval adjusting cells SF that do not have the bridge patterns br. Consequently, in the seal ring area SR, an area corresponding to the bridge interval adjusting cell group Gsf does not have the bridge patterns br. Thus, if a local area cannot contain the bridge patterns br because of the relationship between the length of the seal ring edge Se1 and the width wse of the seal ring edge cell, an area not containing the bridge patterns br is set near the center of the chip peripheral part 11.

A feature of the seal ring area SR involving local relocation of the bridge patterns br is recognized as an interval between the bridge patterns br. As shown in FIG. 2, in the first seal ring edge cell group Gse1, the bridge patterns br are spaced with a pitch equal to the width wse of the seal ring edge cell SE. In other words, in the first seal ring edge cell group Gse1 disposed adjacent to the seal ring corner cell SC1, a predetermined number of bridge patterns br are spaced with a first interval ds1 (=wse).

The bridge patterns br disposed on opposite sides of the bridge interval adjusting cell group Gsf are spaced at a second interval ds2. The second interval ds2 is substantially equal to the sum of the widths of the bridge interval adjusting cells SF disposed at the interval ds1 over the bridge interval adjusting cell group Gsf.

In other words, the interval ds1 and the interval ds2 have the following relationship:

$$ds1 < ds2$$

Thus, the bridge patterns br are locally relocated, that is, an interval between the bridge patterns br is increased near the center of the chip peripheral part 11.

The bridge patterns br in the seal ring area SR are preferably disposed in consideration of an interval ds3 between the bridge patterns br contained in the seal ring corner cell SC1 and the bridge patterns br disposed on the left ends of the first seal ring edge cell group Gse1. In other words, the interval ds3 is preferably set smaller than the interval ds2 (ds3<ds2) between the bridge patterns br set near the center of the chip peripheral part 11. More preferably, the interval ds3 is equal to the interval ds1 (ds3=ds1).

Referring to FIGS. 3A to 3C, a plan view and a cross-sectional view of the seal ring edge cell SE provided in the semiconductor device 1 will be discussed below according to the first embodiment.

The seal ring edge cell SE includes wiring layers M1 to M6 formed over a semiconductor substrate (not shown) and vias V12 to V56 coupling the wiring layers. The vias V12 to V56 are embedded into an interlayer insulating layer (not shown).

FIG. 3A is a plan view of the wiring layers M1 to M4 and the vias V12 to V45 which are provided in the seal ring edge cell SE. The wiring layers M1 to M4 and the vias V12 to V45 are identical in shape in plan view. Eight horizontal patterns configure parts of the seal rings sr1 to sr8. Seven vertical patterns configure the bridge pattern br. wse denotes the width of the seal ring edge cell SE while hse denotes the height of the seal ring edge cell SE.

FIG. 3B is a plan view of the wiring layers M5 and M6 and the via V56 that are provided in the seal ring edge cell SE. Three wide wiring patterns indicate the wiring layers M5 and M6 that are identical in shape in plan view. Two narrow wiring patterns indicate the shapes of the wiring layers M5. The wide wiring patterns are formed over the two seal rings that are each configured by the wiring layers M1 to M4 and are disposed directly under the wiring patterns. The narrow wiring patterns overlap the seal ring in plan view. The seal ring includes the wiring layers M1 to M4 and is disposed directly under the wiring patterns. The wide wiring patterns and the narrow wiring patterns all configure parts of the seal rings sr1 to sr8.

FIG. 3C is a cross-sectional view taken along Y11-Y11' of the seal ring edge cell SE.

The wiring layers M1 and M2, the wiring layers M2 and M3, the wiring layers M3 and M4, the wiring layers M4 and M5, and the wiring layers M5 and M6 are coupled via the via V12, the via V23, the via V34, the via V45, and the via V56, respectively. The shapes of the wiring layer M6 and the via V56 have minimum dimensions that are set larger than those of the lower wires M1 to M5 and the vias V12 to V45.

Figure 4A:
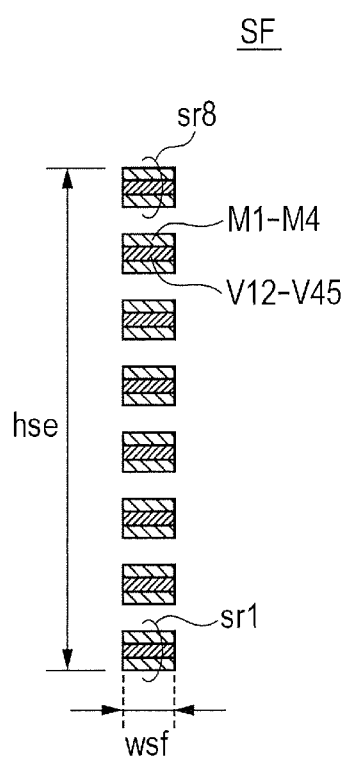
FIGS. 4A and 4B are a plan view and a cross-sectional view of a bridge interval adjusting cell provided in the semiconductor device according to the first embodiment.
Figure 4B:
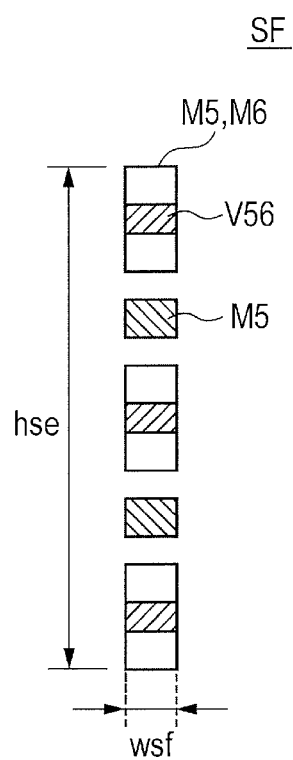

Referring to FIGS. 4A and 4B, a plan view and a cross-sectional view of the bridge interval adjusting cell SF provided in the semiconductor device 1 will be discussed below according to the first embodiment.

FIG. 4A is a plan view the wiring layers M1 to M4 and the vias V12 to V45 which are provided in the bridge interval adjusting cell SF. The wiring layers M1 to M4 and the vias V12 to V45 are identical in shape in plan view. Eight horizontal patterns configure parts of the seal rings sr1 to sr8. The bridge interval adjusting cell SF has a width of wsf and the height of the bridge interval adjusting cell SF is set at hse as the seal ring edge cell SE.

Unlike the seal ring edge cell SE, the bridge interval adjusting cell SF does not have the bridge patterns br. As described above, the bridge interval adjusting cell group Gsf includes the bridge interval adjusting cells SF that are disposed adjacent to each other. If the first seal ring edge cell group Gse1 and the second seal ring edge cell group Gse2 are spaced at an interval that is not an integral multiple of the width wsf of the bridge interval adjusting cell SF, an interval corresponding to the value of the decimal part causes the bridge interval adjusting cells SF to partially "overlie" the seal ring edge cell SE disposed on the left end of the second seal ring edge cell group Gse2.

Referring to FIGS. 5A and 5B, plan views of the seal ring corner cell SC provided in the semiconductor device 1 will be discussed below according to the first embodiment.

FIG. 5A is a plan view of the wiring layers M1 to M4 and the vias V12 to V45 that are provided in the seal ring corner cell SC. The wiring layers M1 to M4 and the vias V12 to V45 are identical in shape in plan view. Eight patterns with corners configure parts of the seal rings sr1 to sr8. The bridge patterns br are disposed among the seal rings sr1 and sr8 perpendicularly to the directions of the seal rings.

FIG. 5B is a plane view of the wiring layers M5 and M6 and the vias V56 that are provided in the seal ring corner cell SC. Three wide wiring patterns indicate the wiring layers M5 and M6 that are identical in shape in plan view. Two narrow wiring patterns indicate the shape of the wiring layer M5. The wide wiring patterns are formed over the two seal rings that are each configured by the wiring layers M1 to M4 and are disposed directly under the wiring patterns. The narrow wiring pattern is formed so as to overlie in plan view the seal ring that is configured by the wiring layers M1 to M4 and is disposed directly under the wiring pattern. The wide wiring patterns and the narrow wiring patterns all configure parts of the seal rings sr1 to sr8. The seal ring corner cell SC has a width of wsc and a height of hsc.

FIGS. 5A and 5B show examples of the seal ring corner cell SC. The shapes of the seal rings on the corners of the semiconductor device 1 are properly set in consideration of, for example, a stress applied to the corner or the characteristics of the interlayer insulating layer.

Figure 6:
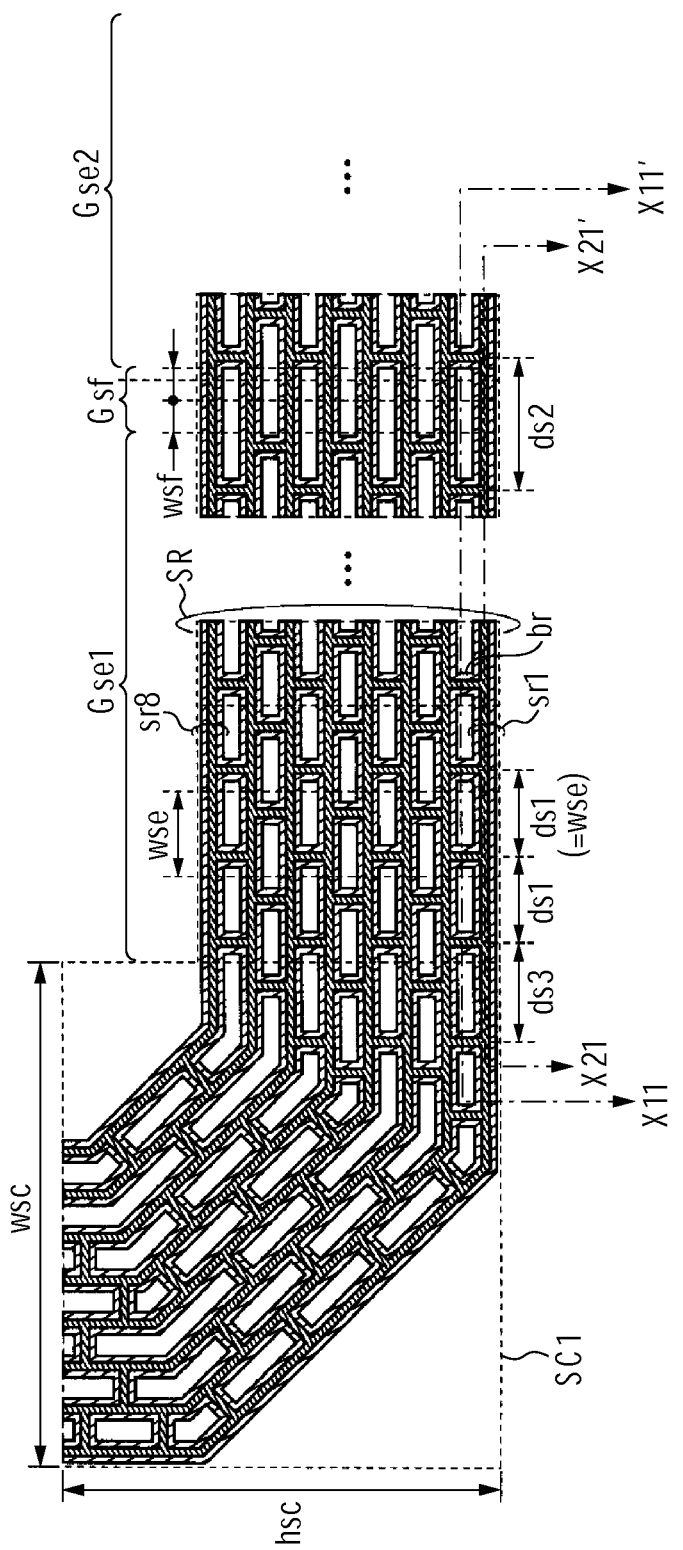
FIG. 6 is a plan view of a seal ring area provided in the semiconductor device according to the first embodiment.

Referring to FIG. 6, a plan view of the seal ring area SR provided in the semiconductor device 1 will be discussed below according to the first embodiment.

FIG. 6 is an enlarged plan view of a lower left part of the semiconductor device 1 illustrated in FIG. 2. The first seal ring edge cell group Gse1 is disposed adjacent to the seal ring corner cell SC1. The bridge interval adjusting cell group Gsf is disposed between the first seal ring edge cell group Gse1 and the second seal ring edge cell group Gse2. The two bridge interval adjusting cells SF are disposed in the bridge interval adjusting cell group Gsf illustrated in FIG. 6. The bridge interval adjusting cells SF are disposed adjacent to each other. The right bridge interval adjusting cell SF partially overlies the seal ring edge cell SE disposed on the left end of the second seal ring edge cell group Gse2.

Figure 7A:
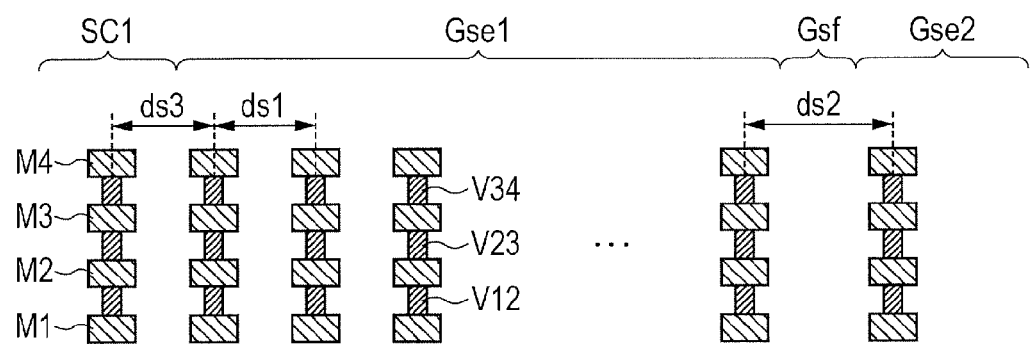
FIGS. 7A and 7B are cross-sectional views of a seal ring area provided in the semiconductor device according to the first embodiment.
Figure 7B:
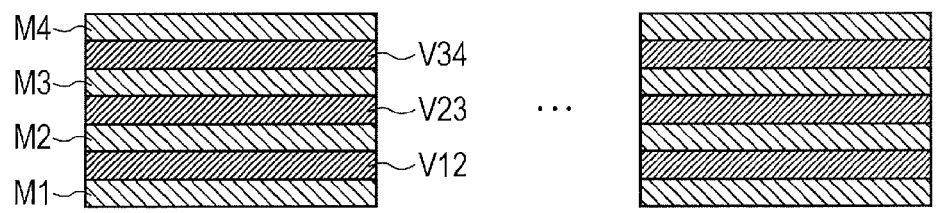

Referring to FIGS. 7A and 7B, a cross-sectional view of the seal ring area SR provided in the semiconductor device 1 will be discussed below according to the first embodiment.

FIG. 7A is a cross-sectional view taken along line X11-X11' of the seal ring area SR illustrated in FIG. 6. In other words, FIG. 7A shows a cross section of the bridge patterns br disposed between the seal rings sr1 and sr2 illustrated in FIG. 6. The bridge pattern br includes the wiring layers M1 to M4 and the vias V12 to V34 that are identical in shape. To avoid complexity in the drawings, the wiring layers M5 and M6 and the vias V45 and V46 are omitted (see FIGS. 3A to 3C).

In the first seal ring edge cell group Gse1, the bridge patterns br are spaced at the interval ds1, that is, with a pitch equal to the width wse of the seal ring edge cell SE. In FIG. 7A, a center distance between the wiring layers M4 is defined as the interval of the bridge patterns br.

The bridge patterns br are spaced at the interval ds2, which has a larger value than the interval ds1, with the bridge interval adjusting cell group Gsf interposed between the bridge patterns br. A difference between the interval ds2 and the interval ds1 is substantially equal to the sum of the widths wsf of the bridge interval adjusting cells SF.

The bridge patterns br opposed to each other with respect to the boundary area between the seal ring corner cell SC1 and the first seal ring edge cell group Gse1 are spaced at the interval ds3. The interval ds3 is preferably smaller than the interval ds2. The interval ds3 and the interval ds1 are more preferably equal to each other.

FIG. 7B is a cross-sectional view taken along line X21-X21' of the seal ring area SR illustrated in FIG. 6. In other words, FIG. 7B shows a cross section of the seal ring sr1 illustrated in FIG. 6. As is understood from the cross-sectional view, the seal ring sr1 is configured as a "wall" made of conductive materials of the wiring layers M1 to M4 and the vias V12 to V34. The bridge patterns (not shown) are configured like the seal ring sr1.

The bridge patterns br locally positioned in the semiconductor device 1 have the following effects:

A mechanical stress is applied to the seal ring area SR by a stress applied to a chip corner of the semiconductor device 1. The seal ring area SR includes the seal rings sr1 to sr8 surrounding the circuit design area 1D like multiple layers and the bridge patterns br. In order to increase the mechanical strength of the seal ring area, the bridge patterns br are desirably spaced at predetermined equal intervals under the design rule. The data structure of the seal ring area SR may, however, require local positioning (an increase of the interval) of the bridge patterns br.

In the semiconductor device 1 according to the first embodiment, the locally positioned bridge patterns br are located around the centers of the chip peripheral parts 11 to 14 other than the chip corners. This provides the semiconductor device 1 with high reliability while keeping mechanical strength in the seal ring area SR on the chip corners, and facilitates the layout design of the seal ring area SR.

<Seal Ring/Crack Extension Preventing Layout Generating System>

Figure 8:
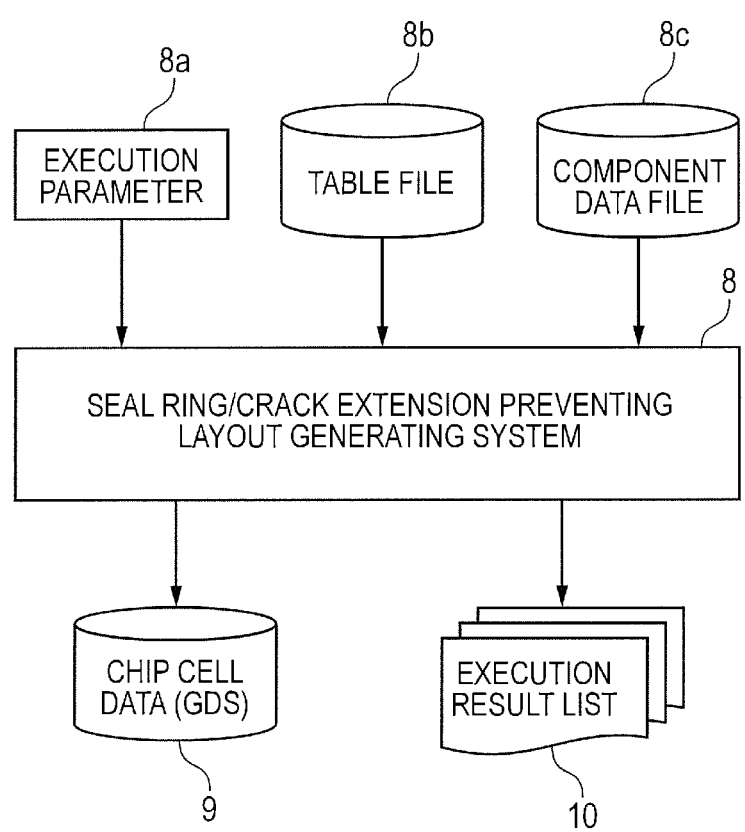
FIG. 8 is a schematic diagram of a seal ring/crack extension preventing layout generating system according to the embodiment.

Referring to FIG. 8, the configuration of a seal ring/crack extension preventing layout generating system 8 will be described below according to the embodiment.

The seal ring/crack extension preventing layout generating system 8 generates the seal ring area SR that surrounds the circuit design area 1D provided in the semiconductor device 1.

The seal ring/crack extension preventing layout generating system 8 outputs chip cell data 9 and an execution result list 10 based on an execution parameter 8a, a table file 8b, and a component data file 8c.

The execution parameter 8a includes the file name of design data required for generating the seal ring area SR, the file name of the circuit design area 1D, and the chip size of the semiconductor device 1. The table file 8b is a file for specifying information on cells configuring the seal ring area SR and the layout specifications of the cells. These files are prepared for the respective manufacturing process specifications of the semiconductor device 1. The component data file 8c contains layout data on the cells configuring the seal ring area SR.

The chip cell data 9 is data obtained by adding, for example, the seal ring area SR to the circuit design area 1D. The execution result list 10 includes the execution log and the execution parameter description file of the seal ring/crack extension preventing layout generating system 8.

Figure 9:
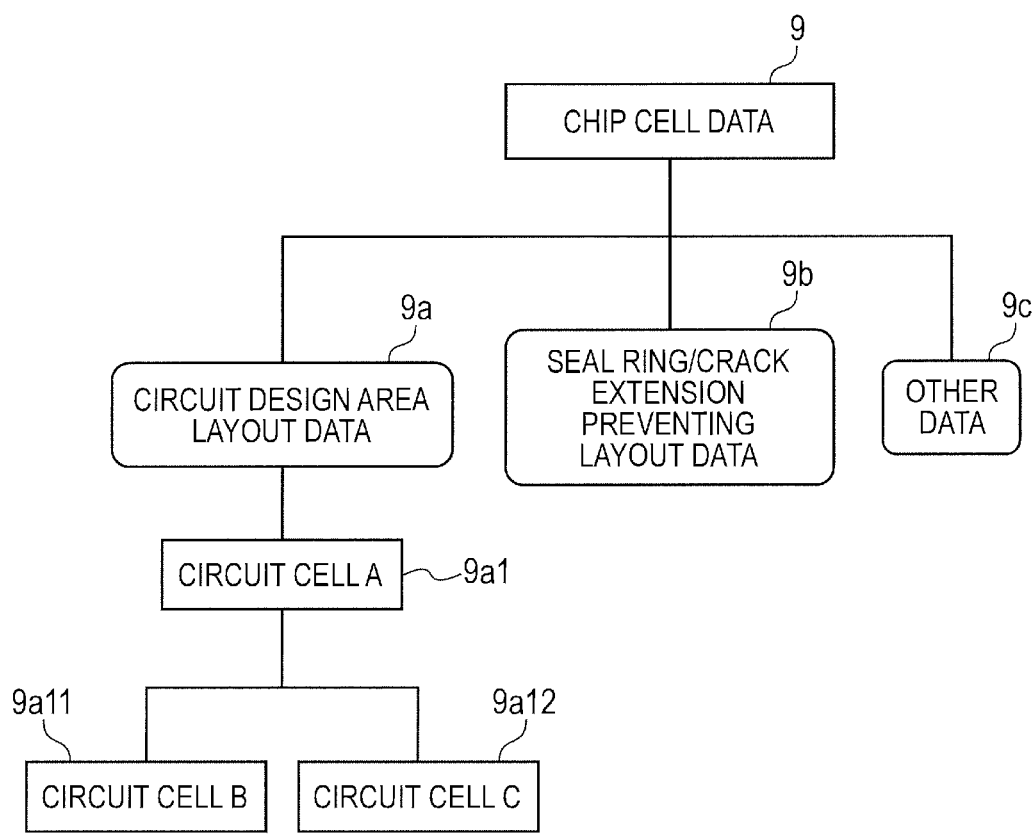
FIG. 9 is a schematic diagram of chip cell data generated by the seal ring/crack extension preventing layout generating system according to the embodiment.

Referring to FIG. 9, the configuration of the chip cell data 9 generated by the seal ring/crack extension preventing layout generating system 8 will be described below.

The chip cell data 9 includes layout data 9a for the circuit design area 1D, layout data 9b for the seal ring area SR, and other data 9c. The layout data 9a for the circuit design area 1D has a hierarchical structure. For example, data 9a1 for a circuit cell A includes data 9a11 for a circuit cell B and data 9a12 for a circuit cell C.

Referring to FIG. 10 and FIGS. 11 to 15, the processing steps of the seal ring/crack extension preventing layout generating system 8 will be described below.

Figure 10:
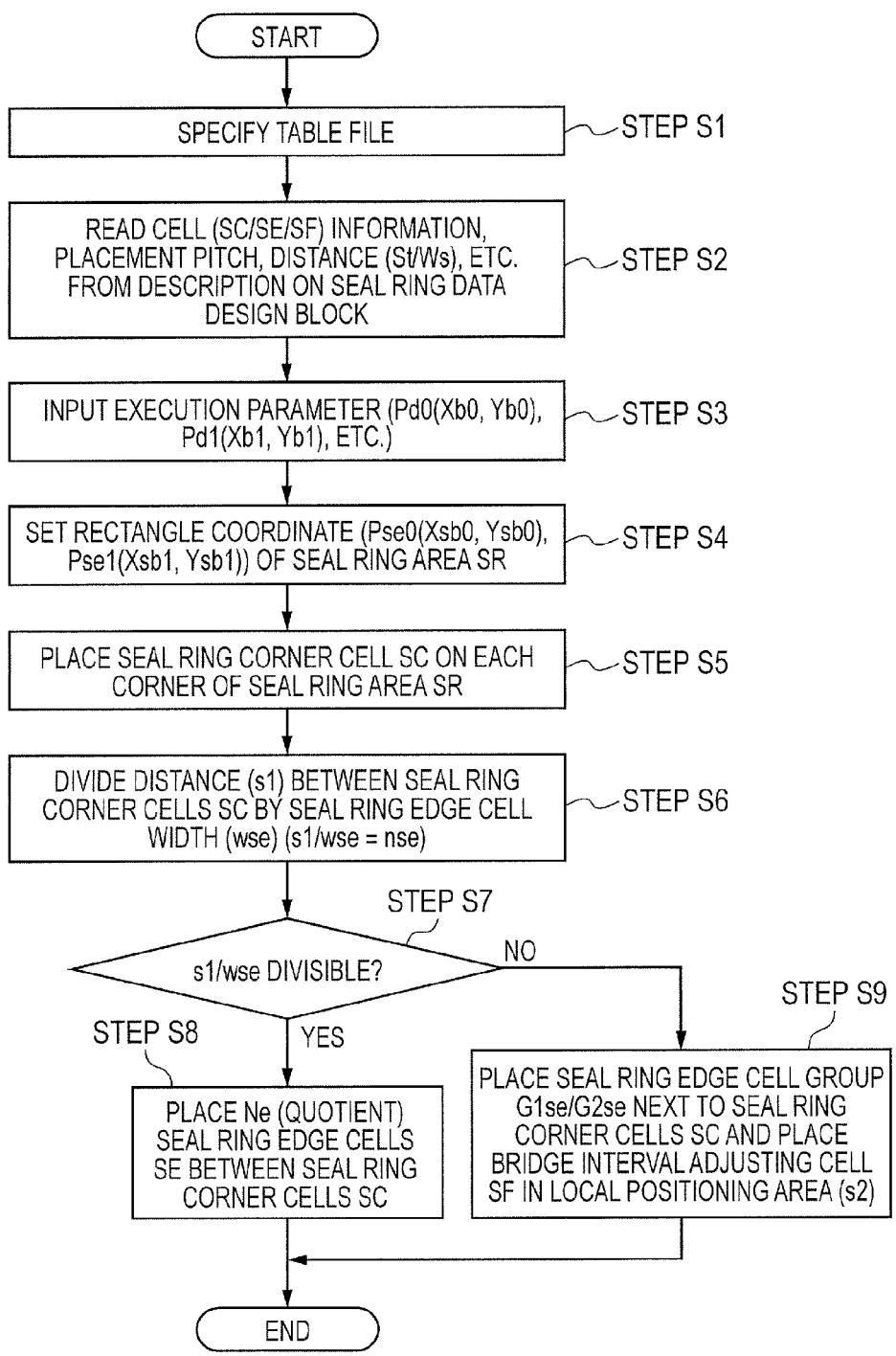
FIG. 10 is a flowchart showing the steps of generating the seal ring area by the seal ring/crack extension preventing layout generating system according to the embodiment.

FIG. 10 shows steps S1 to S9 for generating the seal ring area SR by the seal ring/crack extension preventing layout generating system 8.

Figure 11:
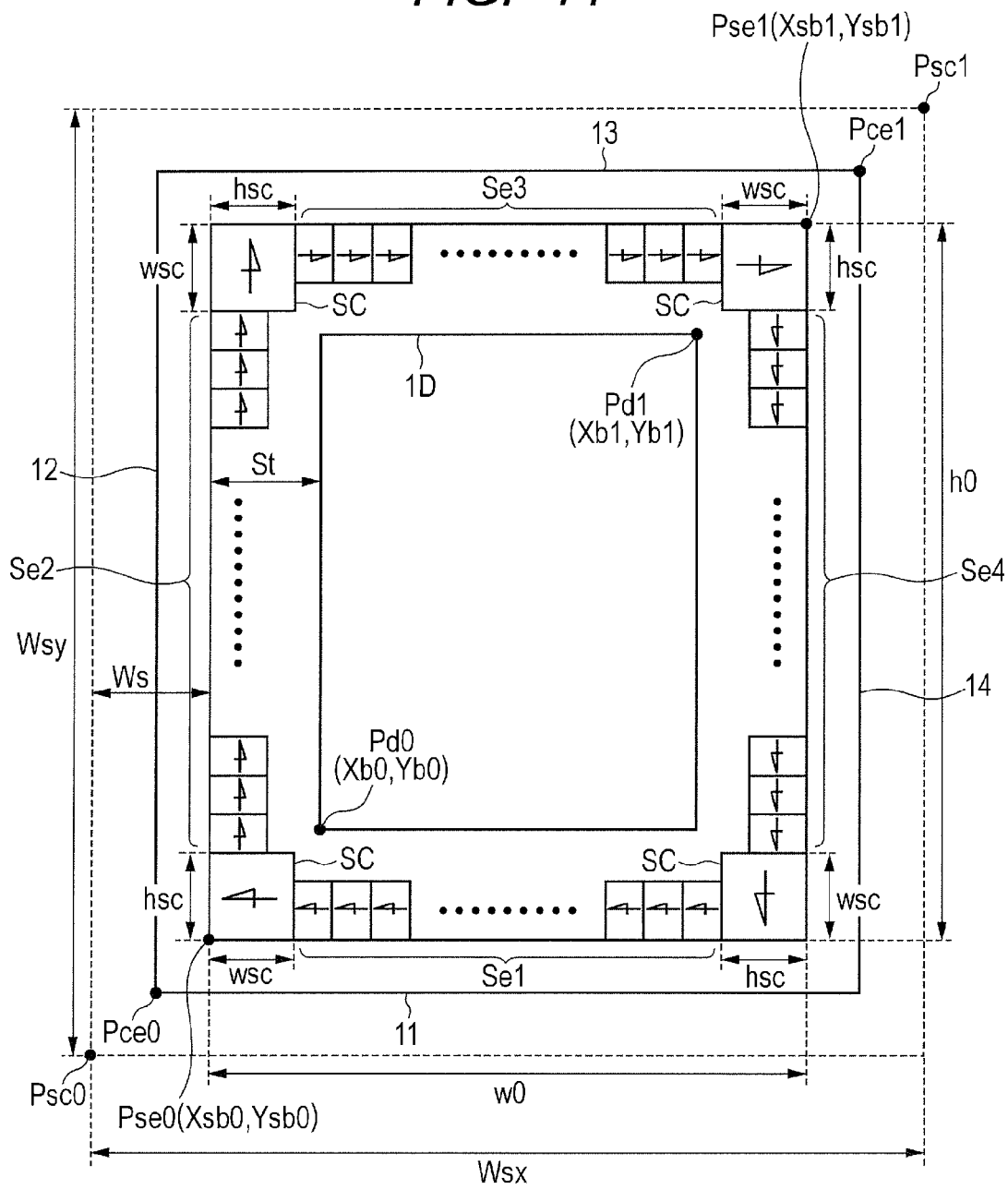
FIG. 11 shows the relationship between the rectangle coordinates of main areas necessary for the steps of generating the seal ring area in FIG. 10 and a distance between the main areas.

FIG. 11 shows the relationship between the rectangle coordinates of main areas necessary for the generation steps in FIG. 10 and a distance between the main areas.

Figure 12:
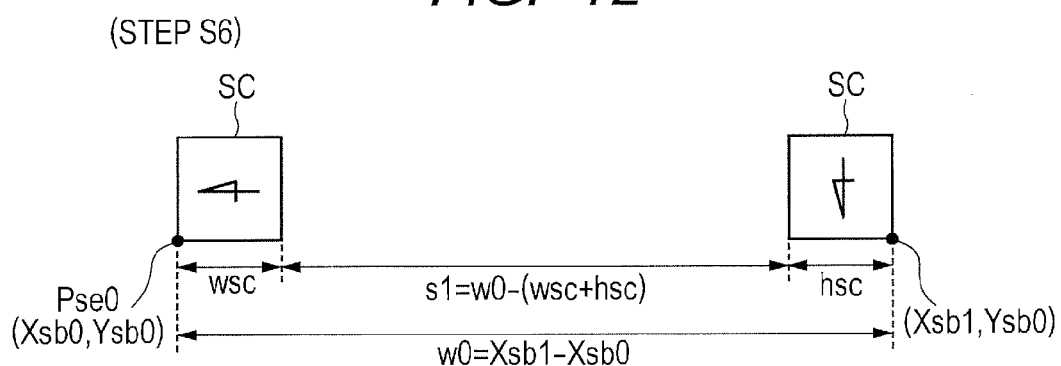
FIG. 12 is an explanatory drawing of an interval between the seal ring corner cells, the interval being calculated in step S6 of FIG. 10.

FIG. 12 shows an interval s1 between the seal ring corner cells SC. The interval s1 is calculated in step S6 of FIG. 10.

Figure 13:
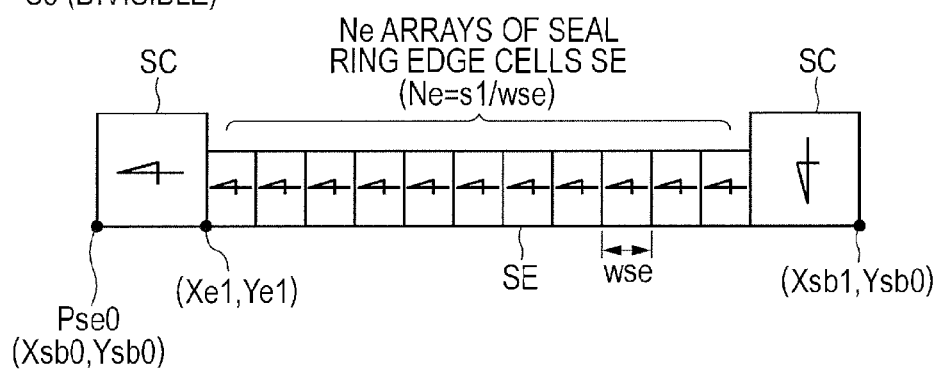
FIG. 13 shows a layout of a predetermined number of seal ring edge cells that are disposed between the seal ring corner cells based on processing in step S8 of FIG. 10.

FIG. 13 shows a layout of a predetermined number of seal ring edge cells SE that are disposed between the seal ring corner cells SC based on processing in step S8 of FIG. 10.

Figure 14:
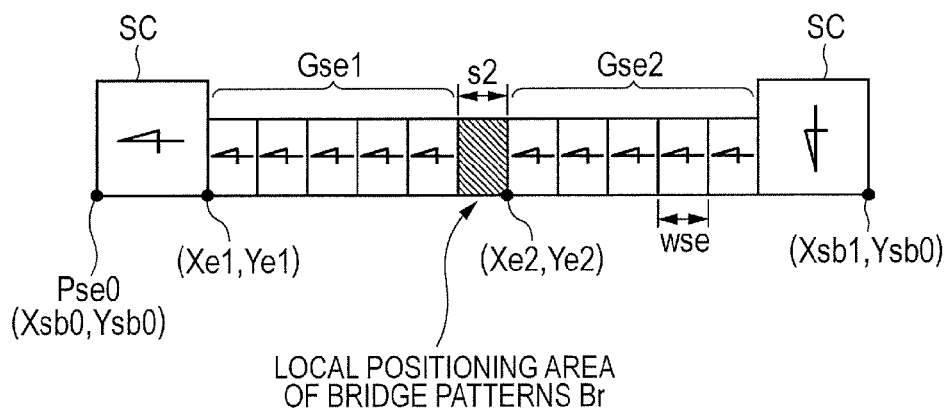
FIG. 14 shows a layout of a first seal ring edge cell group and a second seal ring edge cell group which are disposed between the seal ring corner cells based on processing in step S9 of FIG. 10.

FIG. 14 shows a layout of the first seal ring edge cell group Gse1 and the second seal ring edge cell group Gse2 which are disposed between the seal ring corner cells SC based on processing in step S9 of FIG. 10.

Figure 15:
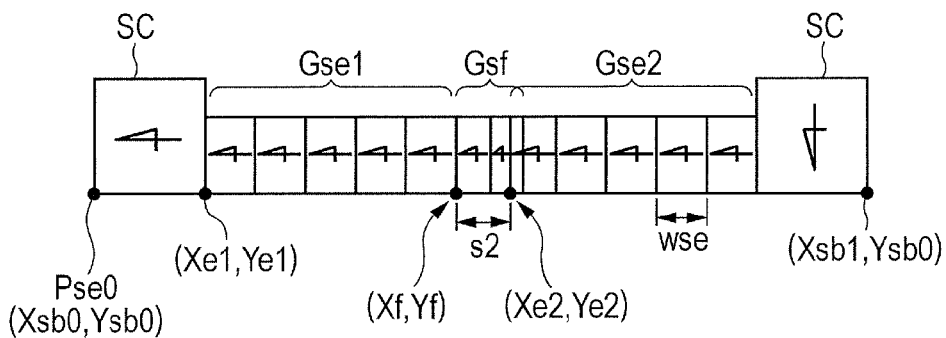
FIG. 15 shows a layout of a seal interval adjusting cell group disposed based on the processing in step S9 of FIG. 10.

FIG. 15 shows a layout of the bridge interval adjusting cell group Gsf disposed based on the processing in step S9 of FIG. 10.

The seal ring/crack extension preventing layout generating system 8 in FIG. 8 performs the processing steps S1 to S9 of FIG. 10.

(Step S1)

A table file for a used process specification is specified from the table file 8b prepared for each manufacturing process specification of the semiconductor device 1.

(Step S2)

Information on the cell names/cell sizes/placement pitches of the used seal ring corner cell SC, the used seal ring edge cell SE, and the used bridge interval adjusting cell SF is inputted to the seal ring/crack extension preventing layout generating system 8 based on a description on a seal ring data design rule block contained in the table file specified in step S1.

Furthermore, a distance Ws and a distance St are inputted to the seal ring/crack extension preventing layout generating system 8 based on a description on the seal ring data design rule block (see FIG. 11). The distance Ws is a distance (not shown) from the scribe line center of the semiconductor device 1 (four sides defined by rectangle coordinates Psc0 and Psc1) to the outer periphery of the seal ring area SR (four sides defined by rectangle coordinates Pse0 and Pse1). The distance St is a distance from the circuit design area 1D (four sides defined by rectangle coordinates Pd0 and Pd1) to the outer periphery of the seal ring area SR.

(Step S3)

The file name and size of the circuit design area 1D are inputted as the execution parameters 8a to the seal ring/crack extension preventing layout generating system 8 by means of a graphical user interface (GUI). Lower left coordinates Pd0(Xb0, Yb0) and upper right coordinates Pd1(Xb1, Yb1) of the circuit design area 1D are inputted as the size of the circuit design area 1D (see FIG. 11).

(Step S4)

The rectangle coordinates Pse0(Xsb0, Ysb0) and Pse1(Xsb1, Ysb1) of the seal ring area SR are determined based on the distance St and the rectangle coordinates of the circuit design area 1D by the following equations (see FIG. 11):

$$Xsb0 = Xb0 - St$$

$$Ysb0 = Yb0 - St$$

$$Xsb1 = Xb1 + St$$

$$Ysb1 = Yb1 + St$$

Moreover, a distance Wsx in X direction and a distance Wsy in Y direction between the scribe line centers are determined by the following equations (see FIG. 11):

$$Wsx = (Xsb1 - Xsb0) + (Ws*2)$$

$$Wsy = (Ysb1 - Ysb0) + (Ws*2)$$

where "*" means a multiplication.

(Step S5)

The seal ring corner cell SC is disposed on each corner of the seal ring area SR. The coordinates on the four corners of the seal ring area SR are determined based on the coordinates Pse0 and Pse1 (see FIG. 11).

(Step S6)

The interval s1 between the seal ring corner cells SC is determined by the following equations (see FIGS. 11 and 12), and then a value nse is calculated by dividing the interval s1 by the width wse of the seal ring edge cell SE. FIG. 12 shows a calculation of the interval s1 between the lower left and lower right seal ring corner cells SC of the seal ring area SR.

$$w0=Xsb1-Xsb0$$

$$s1=w0-(wsc+hsc)$$

$$nse=s1/wse$$

where "/" means a division.
(Step S7)
It is decided whether the divided value nse is only a quotient (s1/wse is divisible) or has a quotient and a remainder (s1/wse is not divisible).
(Step S8)
If the divided value nse is only a quotient, as shown in FIG. 13, Ne (quotient) arrays of seal ring edge cells SE are disposed adjacent to each other between the seal ring corner cells SC. The placement pitch is set at the width wse of the seal ring edge cell SE.
(Step S9)
If the divided value nse has a quotient and a remainder, as shown in FIG. 14, the first seal ring edge cell group Gse1 and the second seal ring edge cell group Gse2 are disposed between the seal ring corner cells SC. The first seal ring edge cell group Gse1 includes Ne1 arrays of seal ring edge cells SE disposed with a pitch equal to the width wse while the second seal ring edge cell group Gse2 includes Ne2 arrays of seal ring edge cells SE disposed with a pitch equal to the width wse.
Ne1 and Net are set as follows:

$$Ne1=\text{floor}(\text{floor}(Ne)/2) \quad \text{Equation 1}$$

$$Ne2=\text{ceil}(\text{floor}(Ne/2)) \quad \text{Equation 2}$$

where "floor" and "ceil" represent a floor function and a ceiling function, respectively. As shown in equations 1 and 2, the first seal ring edge cell group Gse1 and the second seal ring edge cell group Gse2 contain the seal ring edge cells SE in almost equal numbers.

The first seal ring edge cell group Gse1 and the second seal ring edge cell group Gse2 are disposed adjacent to the respective seal ring corner cells SC. An area (distance s2) between the first seal ring edge cell group Gse1 and the second seal ring edge cell group Gse2 is set at the local positioning area of the bridge patterns br.

As shown in FIG. 15, the local positioning area of the bridge patterns br with the distance s2 contains the bridge interval adjusting cell group Gsf. The bridge interval adjusting cell group Gsf includes Nf1 arrays of bridge interval adjusting cells SF disposed with a pitch equal to the width wsf. The width wsf is the width of the bridge interval adjusting cell SF. Nf1 is set as follows:

$$Nf1=\text{ceil}(s2/wsf)$$

Since values obtained in equations 1 and 2 are nearly equal to each other (Ne2-Ne1=1), the bridge interval adjusting cell group Gsf is disposed substantially at the center between the seal ring corner cells SC.

Data on the bridge interval adjusting cell SF disposed on the right end of the bridge interval adjusting cell group Gsf may partially overlap data on the seal ring edge cell SE disposed on the left end of the second seal ring edge cell group Gse2. The overlapping of data allows the semiconductor device 1 having various circuit design areas and chip sizes to facilitate local positioning of the bridge patterns br in the bridge interval adjusting cells SF that are identical in shape.

The seal ring/crack extension preventing layout generating system 8 has the following effects:

The seal ring/crack extension preventing layout generating system 8 determines the formation area of the seal ring area SR based on the data range of the circuit design area 1D in the table file 8b and the distance St. Furthermore, the scribe line center is determined based on the distance Ws with respect to the formation area of the seal ring area SR. Hence, the layout of the seal ring area SR is easily determined. Furthermore, the formation area of the seal ring area SR does not depend upon the structure of a scribe line.

The seal ring/crack extension preventing layout generating system 8 first places the seal ring corner cell SC on each corner of the seal ring area SR. Next, the first seal ring edge cell group Gse1 and the second seal ring edge cell group Gse2 are disposed next to the seal ring corner cells SC disposed on both ends of the outer periphery of the seal ring area SR. The bridge interval adjusting cell group Gsf are then disposed between the first seal ring edge cell group Gse1 and the second seal ring edge cell group Gse2. Thus, the bridge patterns br are locally positioned near the centers of the chip peripheral parts 11 to 14, keeping the mechanical strength of the seal ring area SR.

Figure 16:
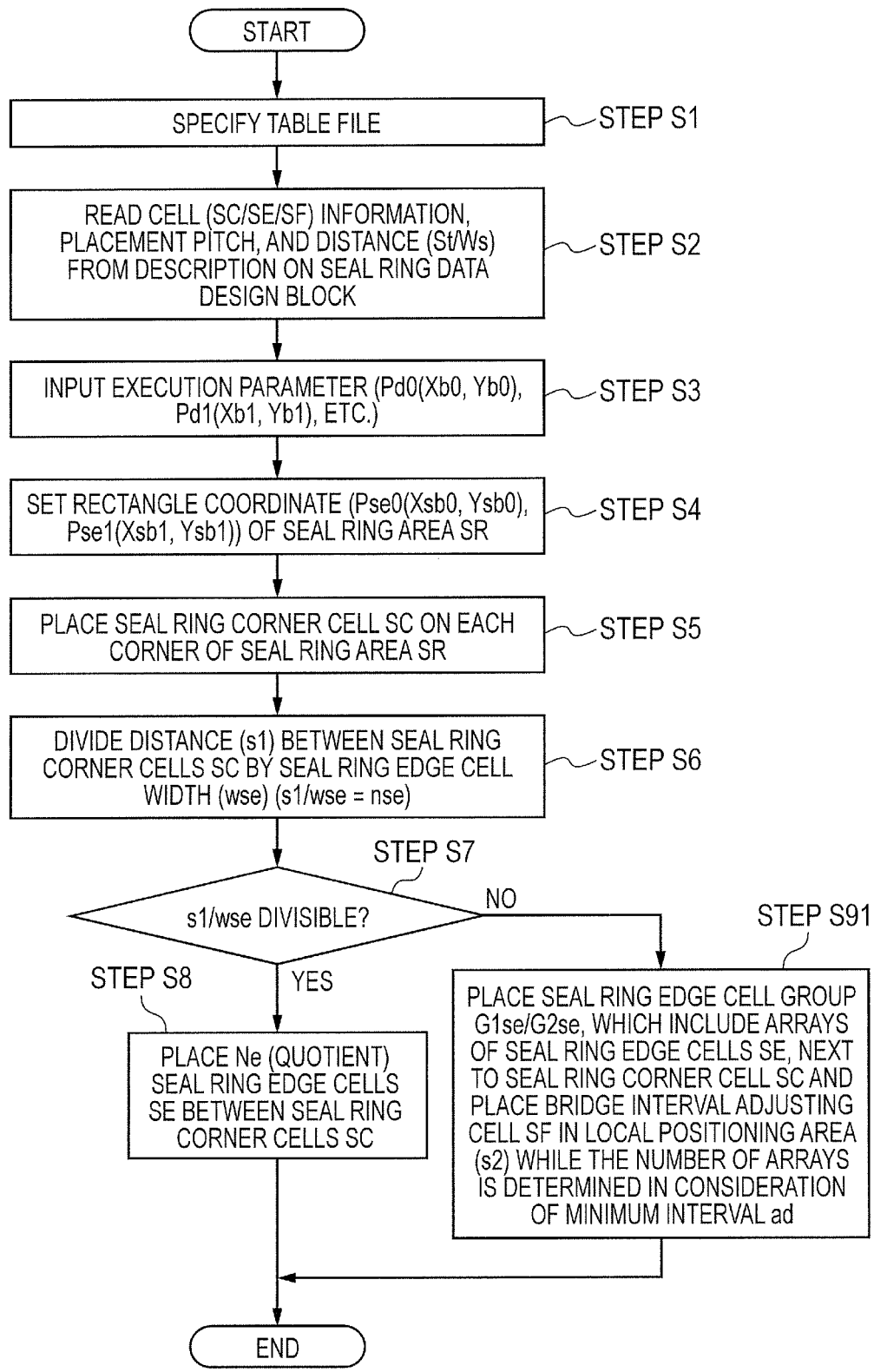
FIG. 16 is a flowchart showing a modification of step S9 of generating the seal ring area in the seal ring/crack extension preventing layout generating system according to the embodiment.

Referring to FIG. 16, a modification of step S9 of generating the seal ring area SR in the seal ring/crack extension preventing layout generating system 8 will be described below.

Step S91 is different from step S9 in FIG. 10 as follows: in step S7 of FIG. 16, if s1/wse (=nse) is not divisible, the seal ring edge cell groups Gse1 and Gse2 including the arrays of seal ring edge cells SE are disposed next to the seal ring corner cell SC1. The number of arrays is determined in consideration of a minimum interval ad in step S91. Specifically, in step S91, the interval s1 is set as "interval s1-ad", and then the quotient of a value obtained by dividing the value of the interval s1 by the width wse of the seal ring edge cell SE is determined. In step S9, the quotient Ne in equations 1 and 2 is replaced with the quotient of (s1-ad)/wse, and then Ne1 and Ne2 are calculated again. The first and second seal ring edge cell groups Gse1 and Gse2 including recalculated Ne1 and Ne2 arrays of the seal ring edge cells SE are disposed between the seal ring corner cells SC (see FIGS. 14 and 15).

Ne1 and Ne2 are calculated in consideration of the minimum interval ad set under the design rule, thereby avoiding design rule violation caused by the layout of the seal ring edge cells SE in the local positioning area (the area with the distance s2 in FIG. 14) of the bridge patterns br.

The seal ring/crack extension preventing layout generating system 8 for performing step S91 has the following effects:

In step S9 of the seal ring/crack extension preventing layout generating system 8, the number of disposed seal ring edge cells SE is set at the quotient obtained by dividing the distance s1, which serves a dividend, between the seal ring corner cells by the width (wse) of the seal ring edge cell SE. If the division result has a remainder, an interval between the bridge patterns br may violate the design rules in the seal ring area SR corresponding to the remainder. In this case, the seal ring area SR needs to be redesigned.

In step S91 that is a modification of step S9, a distance (s1-ad) set between the seal ring corner cells in consideration of the minimum interval ad is set as a dividend. Hence, even if a division result obtained by the divisor of a dividend has a remainder, the interval between the bridge patterns br meets the design rules in the seal ring area SR corresponding to the remainder. Thus, the seal ring area SR does not need to be redesigned.

<Semiconductor Device According to Second Embodiment>

Figure 17:
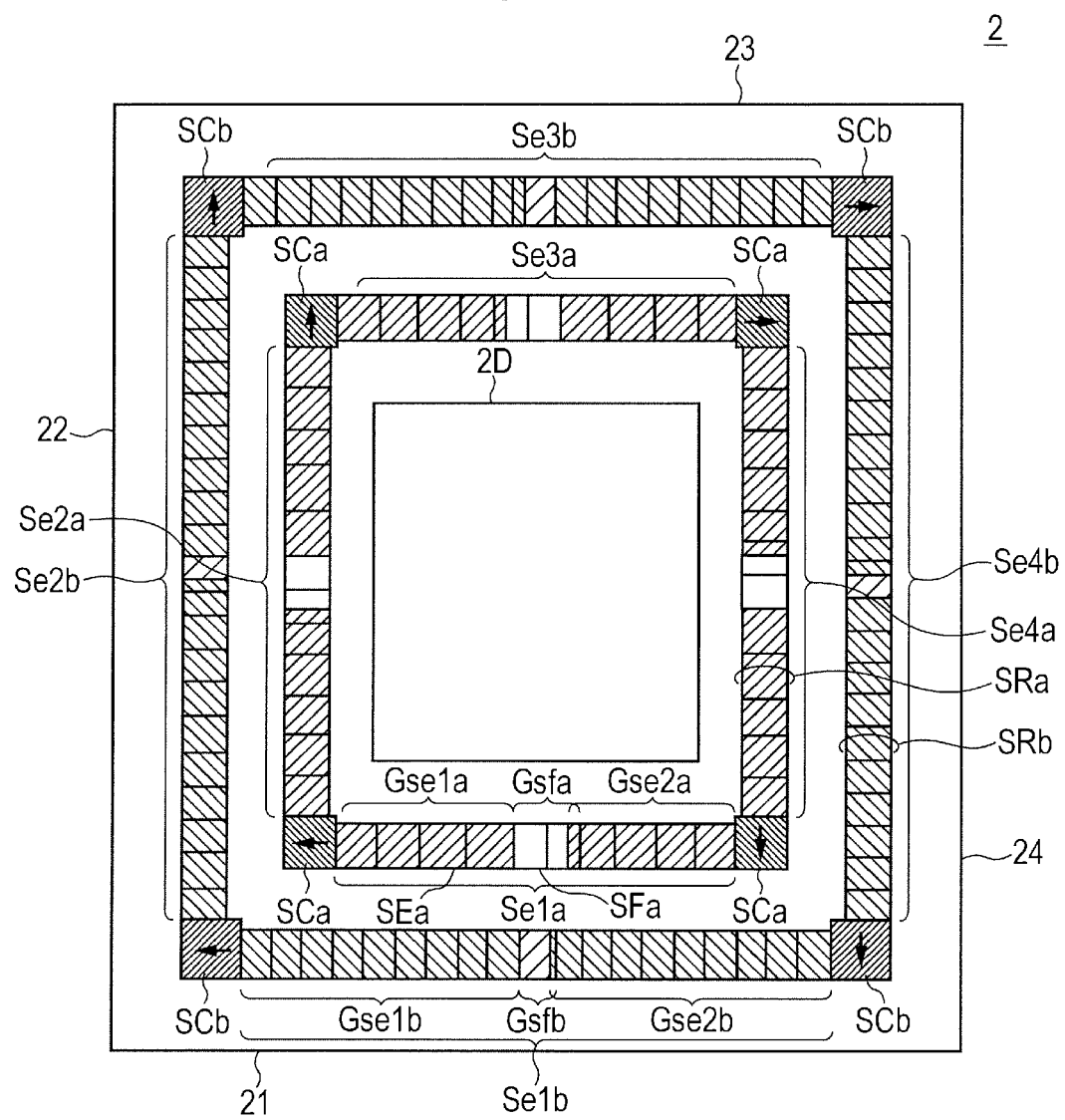
FIG. 17 is a schematic diagram of a semiconductor device according to a second embodiment.

Referring to FIG. 17, the configuration of a semiconductor device 2 according to the second embodiment will be described below.

The semiconductor device 2 includes a circuit design area 2D, a seal ring area SRa, a seal ring area SRb, and chip peripheral parts 21 to 24. The circuit design area 2D and the chip peripheral parts 21 to 24 are identical to those of the semiconductor device 1 according to the first embodiment in FIG. 1 and thus the explanation thereof is omitted.

The circuit design area 2D is surrounded by the seal ring area SRa and the seal ring area SRb. The seal ring area SRa includes four seal ring corner cells SCa oriented in different directions by 90° and seal ring edges Se1a to Se4a disposed among the seal ring corner cells SCa. The seal ring edges Se1a to Se4a include seal ring edge cells SEa and bridge interval adjusting cells SFa that are optionally provided.

The seal ring edge Se1a includes first seal ring edge cells Gse1a, second seal ring edge cells Gse2a, and bridge interval adjusting cells Gsfa. The seal ring edges Se2a to Se4a are identical in configuration to the seal ring edge Se1a.

The seal ring area SRb includes four seal ring corner cells SCb oriented in different directions by 90° and seal ring edges Se1b to Se4b disposed among the seal ring corner cells SCb. The seal ring edges Se1b to Se4b include seal ring edge cells SEb and bridge interval adjusting cells SFb that are optionally provided.

The seal ring edge Se1b includes a first seal ring edge cell group Gse1b, a second seal ring edge cell group Gse2b, and a bridge interval adjusting cell group Gsfb. The seal ring edges Se2a to Se4a are identical in configuration to the seal ring edge Se1a.

Figure 18:
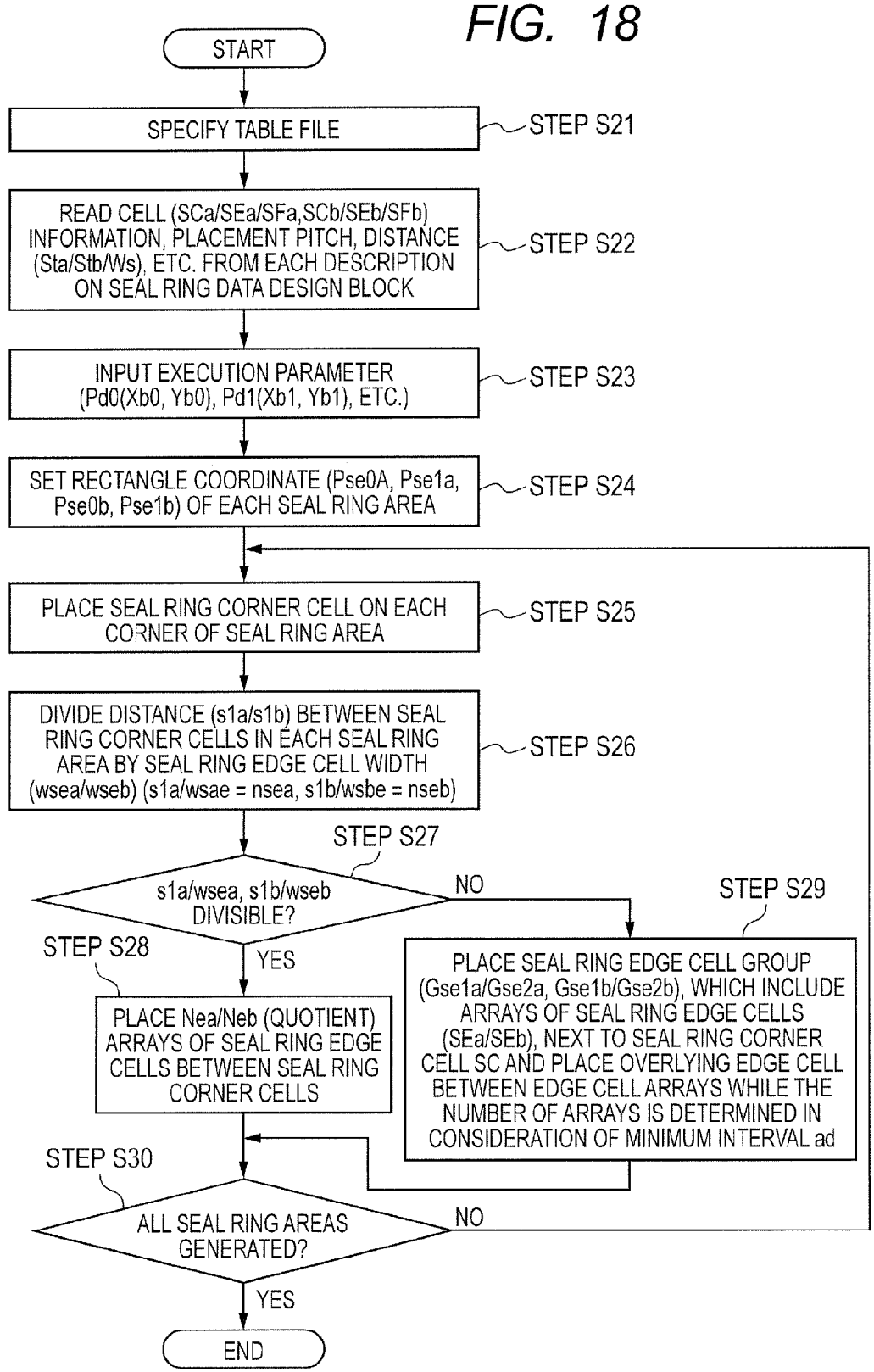
FIG. 18 is a flowchart showing the steps of generating the seal ring areas, which are provided in the semiconductor device of FIG. 17, in the seal ring/crack extension preventing layout generating system of FIG. 8.
Figure 19:
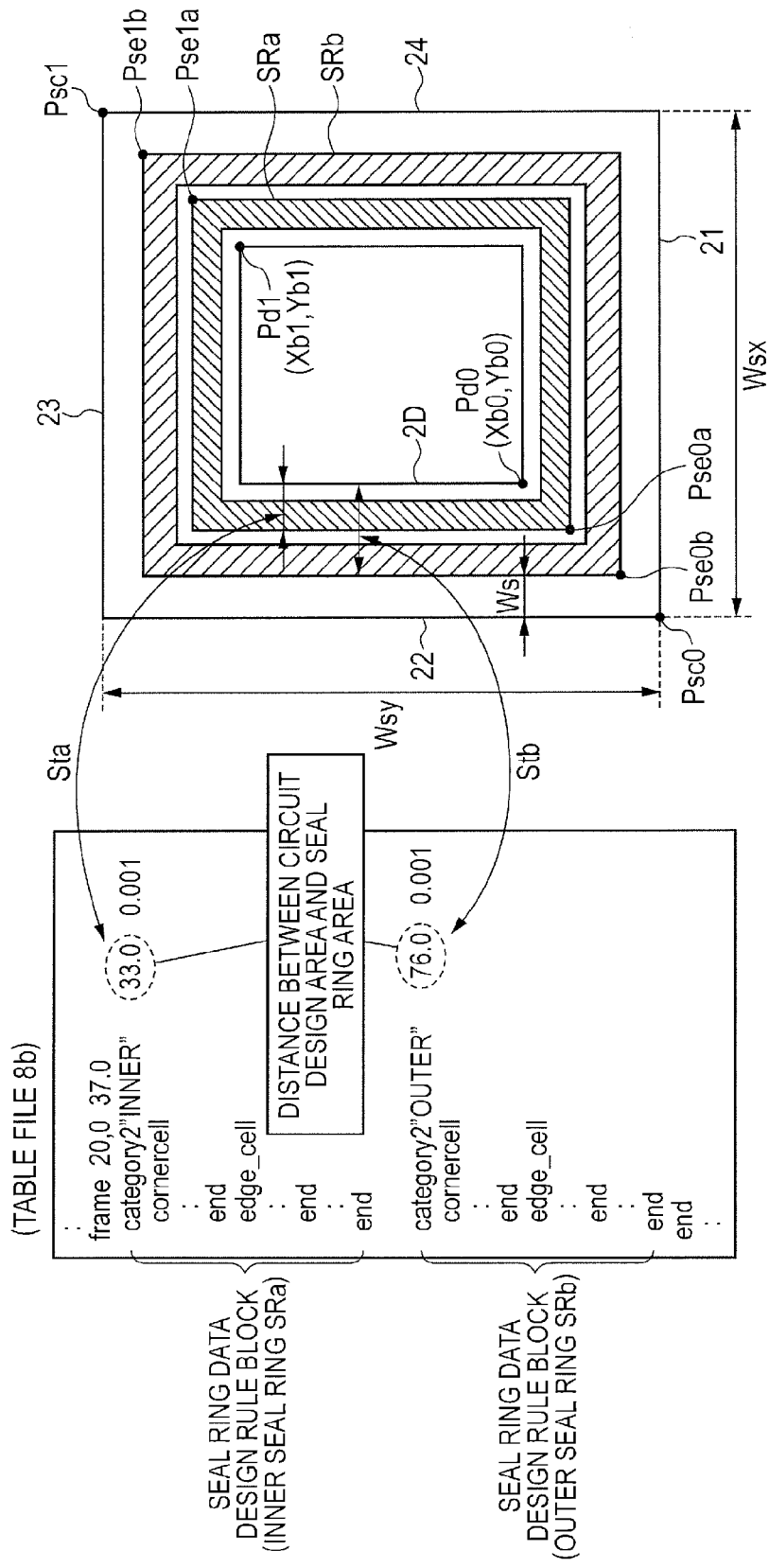
FIG. 19 shows the rectangle coordinates of main areas provided in the semiconductor device of FIG. 17 and the relationship between a distance between the main areas and a table file description.

Referring to FIGS. 18 and 19, the steps of generating the seal ring area SRa and the seal ring area SRb in a seal ring/crack extension preventing layout generating system 8 will be described below.

FIG. 18 is a flowchart showing the steps of generating the seal ring area SRa and the seal ring area SRb in the seal ring/crack extension preventing layout generating system 8 according to the embodiment of FIG. 8.

FIG. 19 is an explanatory drawing of the rectangle coordinates of main areas provided in the semiconductor device 2 according to the second embodiment and the relationship between a distance between the main areas and a seal ring data design rule block contained in a table file 8b.

The seal ring/crack extension preventing layout generating system 8 in FIG. 8 performs the following steps S21 to S30 shown in FIG. 18.

(Step S21)

A table file for a used process specification is specified from the table file 8b prepared for each manufacturing process specification of the semiconductor device 2.

(Step S22)

Based on descriptions of sets of seal ring data design rule blocks contained in the table file specified in step S21, the seal ring/crack extension preventing layout generating system 8 receives information on the cell names/cell sizes/placement pitches of the seal ring corner cells SCa/SCb, the seal ring edge cells SEa/SEb, and the bridge interval adjusting cells SFa/SFb which are used in the sets of seal ring data design rule blocks. As shown in FIG. 19, descriptions of the seal ring data design rule blocks include information on the positions of the inner seal ring area SRa (inner seal ring) and the outer seal ring area SRb (outer seal ring).

Moreover, based on descriptions of sets of seal ring data design rule blocks, a distance Ws, a distance Sta, and a distance Stb are inputted to the seal ring/crack extension preventing layout generating system 8. As shown in FIG. 19, the distance Ws is a distance from the scribe line center (four sides defined by rectangle coordinates Psc0 and Psc1) of the semiconductor device 1 to the outer periphery (four sides defined by rectangle coordinates Pse0b and Pse1b) of the outermost seal ring area SRb. The distance Sta is a distance from the circuit design area 2D to the outer periphery (four sides defined by rectangle coordinates Pse0a and Pse1a) of the seal ring area SRa. The distance Stb is a distance from the circuit design area 2D to the outer periphery (four sides defined by rectangle coordinates Pse0b and Pse1b) of the seal ring area SRb.

(Step S23)

The file name and size of the circuit design area 2D are inputted as execution parameters 8a to the seal ring/crack extension preventing layout generating system 8 by means of a graphical user interface (GUI). Lower left coordinates Pd0(Xb0, Yb0) and upper right coordinates Pd1(Xb1, Yb1) of the circuit design area 2D are inputted as the size of the circuit design area 2D (see FIG. 19).

(Step S24)

The rectangle coordinates of the seal ring area SRa, the rectangle coordinates of the seal ring area SRb, the distance Wsx in X direction between scribe centers, and the distance Wsy in Y direction are calculated based on the seal ring data design rule blocks contained in the table file 8b (see FIG. 19) read in step S22.

The rectangle coordinates Pse0a(Xsb0a, Ysb0a) and Pse1a(Xsb1a, Ysb1a) of the seal ring area SRa are determined by the following equations (see FIG. 19):

$$Xsb0a = Xb0 - Sta$$

$$Ysb0a = Yb0 - Sta$$

$$Xsb1a = Xb1 + Sta$$

$$Ysb1a = Yb1 + Sta$$

The rectangle coordinates Pse0b(Xsb0b, Ysb0b) and Pse1b(Xsb1b, Ysb1b) of the seal ring area SRb are determined by the following equations (see FIG. 19):

$$Xsb0b = Xb0 - Stb$$

$$Ysb0b = Yb0 - Stb$$

$$Xsb1b = Xb1 + Stb$$

$$Ysb1b = Yb1 + Stb$$

In the table file 8b of FIG. 19, the value of the distance Sta is set at 33.0 μm by a description "category2 "INNER" 33.0 . . . ". Based on the description, the seal ring area SRa is located with the distance Sta between the outer periphery of the seal ring area SRa and the circuit design area 2D. Likewise, the value of the distance Stb is set at 76.0 μm based on a description "category2 "OUTER" 76.0 . . . ". Based on the description, the seal ring area SRb is located with the distance Stb between the outer periphery of the seal ring area SRb and the circuit design area 2D.

A distance Wsx in X direction and a distance Wsy in Y direction between the scribe line centers are determined by the following equations (see FIG. 19):

$$Wsx = (Xsb1b - Xsb0b) + (Ws*2)$$

$$Wsy = (Ysb1b - Ysb0b) + (Ws*2)$$

where "*" means a multiplication.

FIG. 19 shows a structural example of the circuit design area 2D surrounded by the seal ring area SRa and the seal ring area SRb and an example of the table file 8*b* that describes the configuration. According to the table file 8*b*, the circuit design area 2D can be easily surrounded by the multiple seal rings. In the configuration where the circuit design area 2D is surrounded by n seal ring areas, it is assumed that distances from the circuit design area 2D to the outer peripheries of the seal ring areas are set at St_1, St_2, . . . , and St_n.

The rectangle coordinates Pse0_max(Xsb0_max, Ysb0_max) and Pse1_max(Xsb1_max, Ysb1_max) of the circuit design area 2D and the seal ring area on the outermost periphery of the circuit design area 2D are determined by the follow equations:

$$Xsb0\_max = Xb0 - St\_max$$

$$Ysb0\_max = Yb0 - St\_max$$

$$Xsb1\_max = Xb1 + St\_max$$

$$Ysb1\_max = Yb1 + St\_max$$

where a distance St_max is a maximum value of the distances St _1 to St_n.

The distance Wsx in X direction and the distance Wsy in Y direction between the scribe line centers are determined by the following equations (see FIG. 19):

$$Wsx = (Xsb1\_max - Xsb0\_max) + (Ws*2)$$

$$Wsy = (Ysb1\_max - Ysb0\_max) + (Ws*2)$$

The processing can easily determine a distance between the scribe centers of the semiconductor device having the multiple seal ring areas.

(Step S25)

The seal ring corner cell SCa is disposed on each corner of the seal ring area SR. The coordinates on the four corners of the seal ring area SRa are determined based on the coordinates Pse0*a* and Pse1*a*. The seal ring corner cells SCb is disposed on each corner of the seal ring area SRb. The coordinates of the four corners of the seal ring area SRb are determined based on the coordinates Pse0*b* and Pse1*b* (FIG. 19).

(Step S26)

An interval s1*a* between the seal ring corner cells SCa provided in the seal ring area SRa is divided by a width wsea of the seal ring edge cell SEa to calculate a divided value nsea. Likewise, a distance s1*b* between the seal ring corner cells SCb provided in the seal ring area SRb is divided by a width wseb of the seal ring edge cell SEb to calculate a divided value nseb.

(Step S27)

It is decided whether the divided value nsea only has a quotient (s1*a*/wsea is divisible) or has a quotient and a remainder (s1*a*/wsea is not divisible). Similarly, it is decided whether the divided value nseb only has a quotient (s1*b*/wseb is divisible) or has a quotient and a remainder (s1*b*/wseb is not divisible).

(Step S28)

If the divided value nsea only has a quotient, Nea (quotient) arrays of the seal ring edge cells SEa are disposed adjacent to each other between the seal ring corner cells SCa. The placement pitch is set at the width wsea of the seal ring edge cell SEa. Similarly, if the divided value nse only has a quotient, Neb (quotient) arrays of the seal ring edge cells SEb are disposed adjacent to each other between the seal ring corner cells SCb. The placement pitch is set at the width wseb of the seal ring edge cell SEb.

(Step S29)

If the divided value nsea has a quotient and a remainder, the number of arrays of the disposed seal ring edge cells SEa is determined in consideration of a minimum interval ad. The seal ring edge cell groups Gse1*a* and Gse2*a* including a predetermined number of the seal ring edge cells SEa are disposed adjacent to the seal ring corner cells SCa. Likewise, if the divided value nseb has a quotient and a remainder, the seal ring edge cell groups Gse1*b* and Gse2*b* including arrays of the seal ring edge cells SEb are disposed adjacent to the corner cells SCb (FIG. 17). The number of arrays is determined in consideration of the minimum interval ad. The number of arrays of the seal ring edge cells SEa placed in the seal ring edge cell group Gse1*a* is equal to the number of arrays in step S91 of generating the seal ring area SR in the seal ring/crack extension preventing layout generating system 8 according to the embodiment, and thus the explanation thereof is omitted.

The seal ring area SRa and the seal ring area SRb in FIG. 17 include the bridge interval adjusting cell group Gsfa and the bridge interval adjusting cell group Gsfb which are disposed near the centers of the chip peripheral parts 21 to 24. Hence, the bridge interval adjusting cell group Gsfa and the bridge interval adjusting cell group Gsfb are close to each other. The bridge interval adjusting cell groups Gsfa and Gsfb may be shifted in opposite directions along the chip peripheral parts 21 to 24.

When the multilayer seal ring areas are generated, the seal ring/crack extension preventing layout generating system 8 has the following effects:

The seal ring/crack extension preventing layout generating system 8 according to the embodiment determines the formation areas of the seal ring area SRa and the seal ring area SRb based on the data range of the circuit design area 2D in the table file 8*b*, the distance Sta, and the distance Stb. Furthermore, the scribe line center is determined based on the distance Ws with respect to the formation area of the seal ring area SRb.

The placement coordinates of all kinds of cell data (including SCa/SCb, SEa/SEb/ and SFa/SFb) configuring the seal ring areas SRa/SRb are determined based on the set values of the distance Sta and the distance Stb. In the table file 8*b*, information on all kinds of cell data placed in the seal ring area SRa and the seal ring area SRb is described as the seal ring data design rule blocks.

The seal ring/crack extension preventing layout generating system 8 generates the multilayer seal ring areas SRa/SRb based on the table file 8*b*. In the generated seal ring areas SRa/SRb, the bridge patterns br are locally positioned near the centers of the chip peripheral parts 21 to 24. Hence, the multiple seal ring areas can be easily designed, providing the semiconductor device with higher moisture resistance.

<Semiconductor Device According to Third Embodiment>

Figure 20:
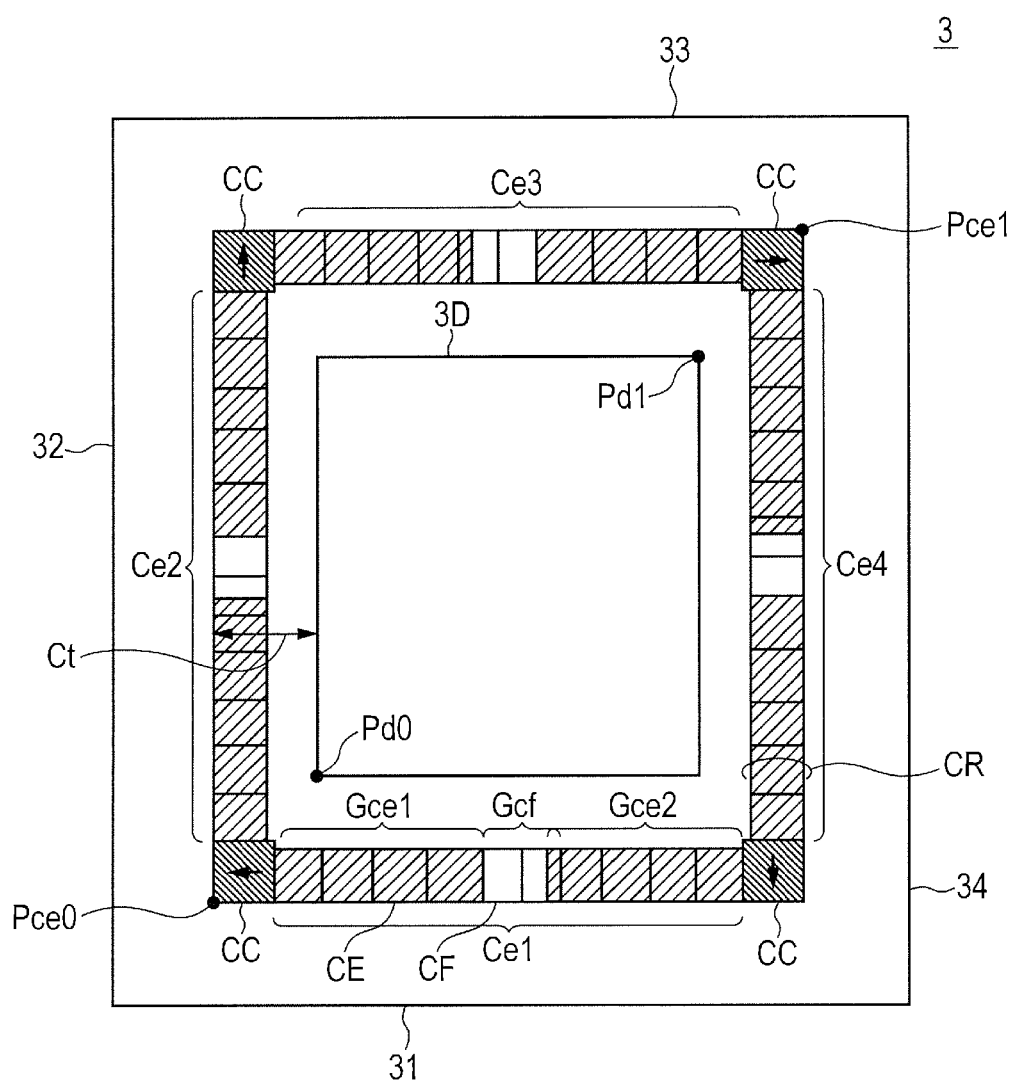
FIG. 20 is schematic diagram of a semiconductor device according to a third embodiment.

Referring to FIG. 20, the configuration of a semiconductor device 3 according to the third embodiment will be described below.

In the following explanation, an interval between dummy patterns DMY1 indicates a center distance between the dummy patterns DMY1 unless otherwise specified.

The semiconductor device 3 includes a circuit design area 3D, a crack extension preventing area CR, and chip peripheral parts 31 to 34. The size of the circuit design area 3D is set by rectangle coordinates Pd0 and Pd1. The outer periphery of the crack extension preventing area CR is set by rectangle coordinates Pce0 and Pce1. A distance between the circuit design area 3D and the outer periphery of the crack extension preventing area CR is set at a distance Ct. The circuit design area 3D and the chip peripheral parts 31 to 34 are identical to the circuit design areas and the chip peripheral parts provided in the semiconductor devices according to the foregoing embodiments, and thus the explanation thereof is omitted The crack extension preventing area CR includes four crack extension preventing corner cells CC disposed near the corners of the semiconductor device 3, and crack extension preventing edges Ce1 to Ce4. The crack extension preventing area CR is disposed to prevent cracks appearing on an interlayer insulating layer or a wiring layer from the chip peripheral parts 31 to 34 of the semiconductor device 3 from extending to the circuit design area 3D.

The crack extension preventing edge Ce1 includes a first crack extension preventing edge cell group Gce1, a second crack extension preventing edge cell group Gce2, and a dummy interval adjusting cell group Gcf.

The first crack extension preventing edge cell group Gce1 is disposed adjacent to the crack extension preventing corner cell CC located on the lower left corner of the semiconductor device 3. The first crack extension preventing edge cell group Gce1 includes a plurality of crack extension preventing edge cells CE that are disposed adjacent to each other along the chip peripheral part 31. The crack extension preventing edge cell CE on the left end of the first crack extension preventing edge cell group Gce1 is disposed adjacent to the crack extension preventing corner cell CC.

The second crack extension preventing edge cell group Gce2 is disposed adjacent to the crack extension preventing corner cell CC located on the lower right corner of the semiconductor device 3. The second crack extension preventing edge cell group Gce2 includes a plurality of crack extension preventing edge cells CE that are disposed adjacent to each other along the chip peripheral part 31. The crack extension preventing edge cell CE on the right end of the second crack extension preventing edge cell group Gce2 is disposed adjacent to the crack extension preventing corner cell CC.

The dummy interval adjusting cell group Gcf is disposed between the crack extension preventing edge cell CE disposed on the right end of the first crack extension preventing edge cell group Gce1 and the crack extension preventing edge cell CE disposed on the left end of the second crack extension preventing edge cell group Gce2. The dummy interval adjusting cell group Gcf includes at least one dummy interval adjusting cell CF.

The dummy interval adjusting cells CF are disposed with a predetermined pitch between the first crack extension preventing edge cell group Gce1 and the second crack extension preventing edge cell group Gce2. In this case, one of the dummy interval adjusting cells CF may partially overlie the crack extension preventing edge cell CE. In FIG. 20, the dummy interval adjusting cell group Gcf includes the two dummy interval adjusting cells CF. The right dummy interval adjusting cell CF partially overlies the crack extension preventing edge cell CE on the right.

Referring to FIGS. 21A to 21C, the configuration of the crack extension preventing area CR provided in the semiconductor device 3 according to the third embodiment will be described below.

FIG. 21A is a plan view of the crack extension preventing edge Ce1 of the semiconductor device 3. As described above, the crack extension preventing edge Ce1 includes the first crack extension preventing edge cell group Gce1, the second crack extension preventing edge cell group Gce2, and the dummy interval adjusting cell group Gcf.

The first crack extension preventing edge cell group Gce1 includes the crack extension preventing edge cells CE, each having a width wce and a height hce. The crack extension preventing edge cells CE includes the four dummy patterns DMY1 and a dummy pattern DMY2. In FIGS. 21A to 21C, the width and the height of the pattern are horizontal and vertical lengths.

In the crack extension preventing edge cell CE, a center distance between the dummy patterns DMY1 is set at a first interval dc1 in a horizontal direction (the orientation of arrays) and in a vertical direction. Moreover, a center distance between the dummy patterns DMY1 of the adjacent crack extension preventing edge cells CE is also set at the first interval dc1. For example, the dummy pattern DMY1 is shaped like a square having a side length under a design rule. The dummy pattern DMY2 has the width wce and the height hce. Typically, the height of the dummy pattern DMY2 and the interval between the dummy pattern DMY2 and the dummy pattern DMY1 are both equal to the side length of the dummy pattern DMY1.

Thus, the dummy patterns DMY1 are equally spaced at the first interval dc1 in the first crack extension preventing edge cell group Gce1. The dummy pattern DMY2 is continuously provided along the chip peripheral part 31. The layout of the dummy patterns DMY1 in the second crack extension preventing edge cell group Gce2 is identical to that in the first crack extension preventing edge cell group Gce1.

The dummy interval adjusting cell group Gcf is disposed between the first crack extension preventing edge cell group Gce1 and the second crack extension preventing edge cell group Gce2. If the length of the crack extension preventing edge Ce1 is an integral multiple of the width wce of the crack extension preventing edge cell CE, the dummy interval adjusting cell group Gcf is not placed on the crack extension preventing edge Ce1 and thus the crack extension preventing edge Ce1 only includes the crack extension preventing edge cells CE. In this case, the crack extension preventing edge cell group Gce1 includes an array of the dummy patterns DMY1 disposed at the first interval dc1 in the vertical and horizontal directions, and the dummy pattern DMY2 continuously formed in the horizontal direction.

If the length of the crack extension preventing edge Ce1 is an integral multiple of the width wce of the crack extension preventing edge cell CE, the crack extension preventing edge cells CE cannot be locally disposed. This is because the interval between the dummy patterns DMY1 is smaller than a minimum interval specified under the design rule if the crack extension preventing edge cell CE is disposed in such an area.

The dummy interval adjusting cell group Gcf is placed in an area that cannot contain the crack extension preventing edge cells CE. In the example of FIGS. 21A to 21C, the dummy interval adjusting cell group Gcf includes the two dummy interval adjusting cells CF. The dummy interval adjusting cell CF is set as a data area having a width wcf and a height hcf. The dummy interval adjusting cell CF has a dummy pattern DMY3 but does not have the dummy pattern DMY1. The dummy pattern DMY3 having the width wcf is as high as the dummy pattern DMY2. The width wcf is set smaller than the width wce of the crack extension preventing edge cell CE (wcf<wce).

The dummy interval adjusting cell CF on the left end of the dummy interval adjusting cell group Gcf is disposed adjacent to the crack extension preventing edge cell CE on the right end of the first crack extension preventing edge cell group Gce1. Data on the dummy interval adjusting cell CF disposed on the right end of the dummy interval adjusting cell group Gcf partially overlaps data on the crack extension preventing edge cell CE disposed on the left end of the second crack extension preventing edge cell group Gce2. The overlapping of the data area allows the dummy interval adjusting cells CF having the single width to form the crack extension preventing area CR even if the area cannot contain the crack extension preventing edge cell CE and varies in width.

As shown in FIG. 21A, the first crack extension preventing edge cell group Gce1 and the second crack extension preventing edge cell group Gce2 include the dummy patterns DMY1 equally spaced at the first interval dc1, whereas the dummy patterns DMY1 on the opposite sides of the dummy interval adjusting cell group Gcf are spaced at a second interval dc2. The second interval dc2 is equal to a value obtained by adding, to the first interval dc1, a width depending upon the number of disposed dummy interval adjusting cells CF having the width wcf. In other words, the first interval dc1 and the second interval ds2 have the following relationship:

$$dc1 < dc2$$

Thus, the interval between the dummy patterns DMY1 is locally increased near the center of the chip peripheral part 31.

The dummy patterns DMY1 are desirably placed in the crack extension preventing area CR in consideration of a third interval dc3 between the dummy pattern DMY1 contained in the crack extension preventing corner cell CC and the dummy pattern DMY1 contained in the first crack extension preventing edge cell group Gce1. In other words, the third interval dc3 is preferably set smaller than the second interval dc2 between the dummy patterns DMY1 near the center of the chip peripheral part 31 (dc3<dc2). The third interval dc3 is more preferably equal to the first interval dc1 (dc3=dc1).

Referring to FIGS. 21B and 21C, cross-sectional views of the crack extension preventing edge Ce1 of the semiconductor device 3 will be described below.

FIG. 21B is a cross-sectional view taken along line X22-X22' of the dummy pattern DMY2 and the dummy pattern DMY3 that are contained in the crack extension preventing edge cells CE and the dummy interval adjusting cells CF. The dummy pattern DMY2 includes wiring layers M1 to M4 and vias V12 to V34 that couple the wiring layers formed in the vertical direction. The dummy pattern DMY2 and the dummy pattern DMY3 are formed over the crack extension preventing edge Ce1.

FIG. 21C is a cross-sectional view taken along line Y22-Y22' of the crack extension preventing edge cell CE. The two dummy patterns DMY1 and the dummy pattern DMY2 each include the wiring layers M1 to M4 and the vias V12 to V34 that are formed in the vertical direction. In FIG. 21C, the dummy interval adjusting cell CF does not have the wiring layers M1 to M4 and the vias V12 to V34 (not shown) at the center and on the right side of the cell in cross section taken along the same direction as Y22-Y22'.

The dummy pattern DMY1 locally positioned in the semiconductor device 3 has the following effects:

A mechanical stress is applied to the crack extension preventing area SR by a stress applied to a chip corner of the semiconductor device 3. The crack extension preventing areas CR are desirably spaced at predetermined equal intervals under the design rule. The data structure of the crack extension preventing area CR may, however, require local positioning (an increase of the interval) of the dummy pattern DMY1.

In the semiconductor device 3 according to the third embodiment, the locally positioned dummy patterns DMY1 are located around the centers of the chip peripheral parts 31 to 44 instead of the chip corners. This suppresses the extension of cracks from the crack extension preventing corner cells CC to the circuit design area 3D, the cracks appearing in, for example, an interlayer insulating layer from the vicinity of the chip corners. Thus, the semiconductor device 3 has higher reliability.

Referring to FIGS. 8 and 20 to 22, the step of generating the crack extension preventing area CR in a seal ring/crack extension preventing layout generating system 8 will be described below.

FIG. 8 shows the configuration of the seal ring/crack extension preventing layout generating system 8.

The seal ring/crack extension preventing layout generating system 8 outputs chip cell data 9 and an execution result list 10 based on an execution parameter 8a, a table file 8b, and a component data file 8c.

The execution parameter 8a includes the file name of design data required for generating the crack extension preventing area CR, the file name of the circuit design area 3D, and the chip size of the semiconductor device 3. The table file 8b is a file for specifying information on the cells configuring the crack extension preventing area CR and the layout specifications of the cells. These files are prepared for the respective manufacturing process specifications of the semiconductor device 3. The component data file 8c contains layout data on the cells configuring the crack extension preventing area CR.

Figure 22:
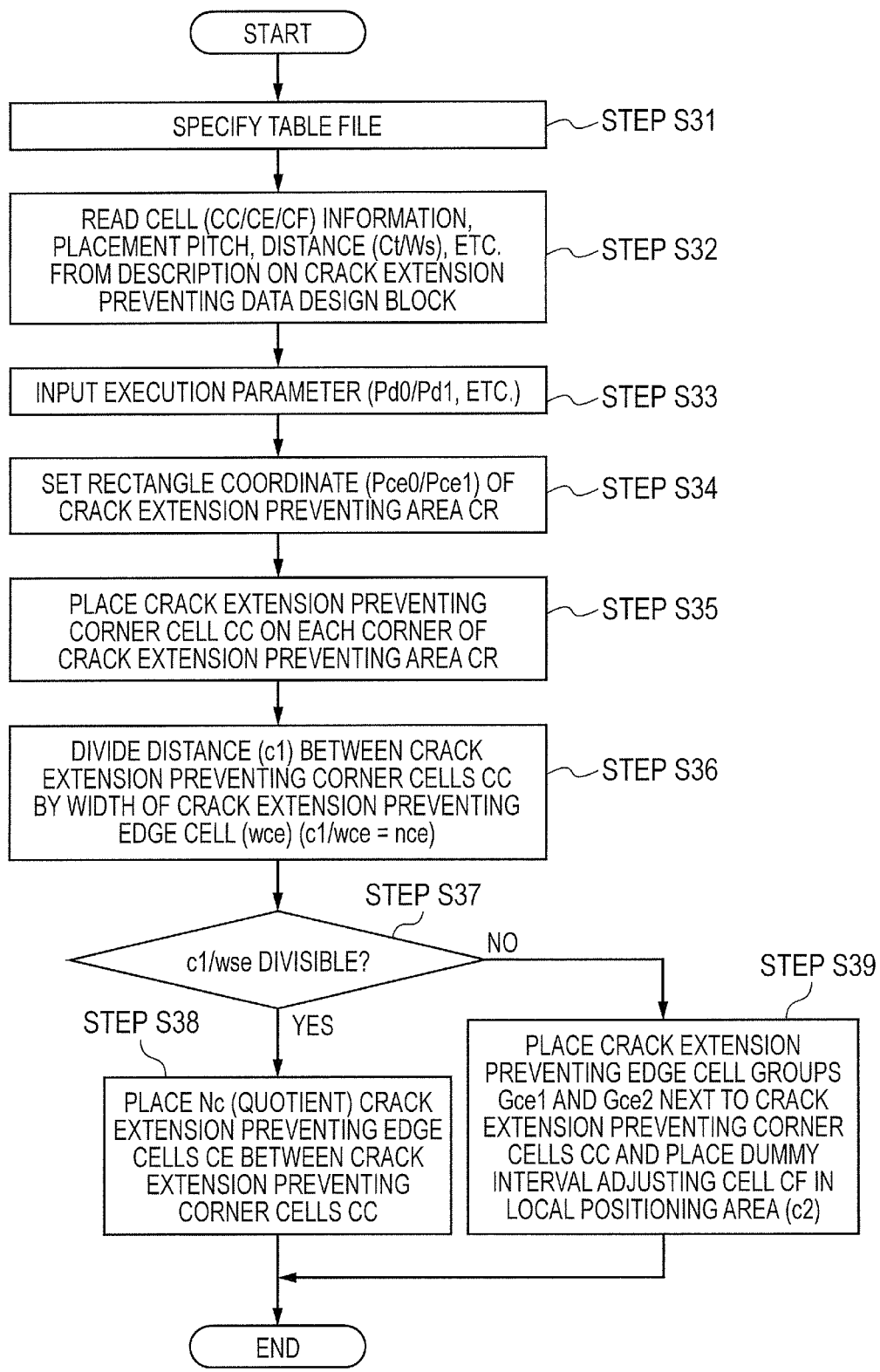
FIG. 22 is a flowchart showing the steps of generating the crack extension preventing area in the seal ring/crack extension preventing layout generating system according to the embodiment.

FIG. 22 shows steps S31 to S39 of generating the crack extension preventing area CR by means of the seal ring/crack extension preventing layout generating system 8.

The chip cell data 9 is data obtained by adding, for example, the crack extension preventing area CR to the circuit design area 3D. The execution result list 10 includes the execution log and the execution parameter description file of the seal ring/crack extension preventing layout generating system 8 (see FIG. 8).

The seal ring/crack extension preventing layout generating system 8 in FIG. 8 performs the processing steps S31 to S39 in FIG. 22.

(Step S31)

A table file for a used process specification is specified from the table file 8b prepared for each manufacturing process specification of the semiconductor device 3.

(Step S32)

Information on the cell names/cell sizes/placement pitches of the used crack extension preventing corner cell CC, the used crack extension preventing edge cell CE, and the used dummy interval adjusting cell CF is inputted to the seal ring/crack extension preventing layout generating system 8 based on a description of a crack extension preventing data design rule block contained in the table file specified in step S31.

Furthermore, a distance We and a distance Ct are inputted to the seal ring/crack extension preventing layout generating system 8 based on a description of the crack extension preventing data design rule block (see FIG. 20). The distance We is a distance (not shown) from the scribe line center of the semiconductor device 3 (four sides defined by rectangle coordinates Psc0 and Psc1) to the outer periphery of the crack extension preventing area CR (four sides defined by rectangle coordinates Pse0 and Pse1). The distance Ct is a distance from the circuit design area 3D (four sides defined by rectangle coordinates Pd0 and Pd1) to the outer periphery of the crack extension preventing area CR (see FIG. 20).
(Step S33)

The file name and size of the circuit design area 3D are inputted as the execution parameters 8a to the seal ring/crack extension preventing layout generating system 8 by means of a graphical user interface (GUI). Lower left coordinates Pd0(Xb0, Yb0) and upper right coordinates Pd1(Xb1, Yb1) of the circuit design area 3D are inputted as the size of the circuit design area 3D (see FIG. 20).
(Step S34)

The rectangle coordinates Pce0 and Pce1 of the crack extension preventing area CR are determined based on the distance Ct and the rectangle coordinates of the circuit design area 3D (see FIG. 20). Moreover, a distance Wcx in X direction and a distance Wcy in Y direction between the scribe line centers are determined (not shown).
(Step S35)

The crack extension preventing corner cell CC is disposed on each corner of the crack extension preventing area CR. The coordinates on the four corners of the crack extension preventing area CR are determined based on the coordinates Pce0 and Pce1 (see FIG. 20).
(Step S36)

The interval c1 between the crack extension preventing corner cells CC is determined (see FIG. 21), and then a value nce is calculated (not shown) by dividing the interval c1 by the width wce of the crack extension preventing edge cell CE.
(Step S37)

It is decided whether the divided value nce only has a quotient (c1/wce is divisible) or has a quotient and a remainder (c1/wce is not divisible).
(Step S38)

If the divided value nce only has a quotient, Nc (quotient) arrays of crack extension preventing edge cells CE are disposed adjacent to each other between the crack extension preventing corner cells CC. The placement pitch is set at the width wce of the crack extension preventing edge cell CE.
(Step S39)

If the divided value nce has a quotient and a remainder, as shown in FIG. 21, the first crack extension preventing edge cell group Gce1 and the second crack extension preventing edge cell group Gce2 are disposed between the crack extension preventing corner cells CC. The first crack extension preventing edge cell group Gce1 includes Nc1 arrays of crack extension preventing edge cells CE disposed with a pitch equal to the width wce while the second crack extension preventing edge cell group Gce2 includes Nc2 arrays of crack extension preventing edge cells CE disposed with a pitch equal to the width wce.

Nc1 and Nc2 are set as follows:

$$Nc1 = \text{floor}(\text{floor}(Nc)/2) \qquad \text{Equation 31}$$

$$Nc2 = \text{ceil}(\text{floor}(Nc/2)) \qquad \text{Equation 32}$$

where "floor" and "ceil" represent a floor function and a ceiling function, respectively.

The first crack extension preventing edge cell group Gce1 and the second crack extension preventing edge cell group Gce2 are disposed adjacent to the respective crack extension preventing corner cells CC. An area (interval c2) between the first crack extension preventing edge cell group Gce1 and the second crack extension preventing edge cell group Gce2 is set at the local positioning area of the dummy patterns DMY1 (see FIGS. 21A to 21C).

The local positioning area of the dummy patterns DMY1 spaced at the interval c2 contains the dummy interval adjusting cell group Gcf. The dummy interval adjusting cell group Gcf includes Ncf1 arrays of dummy interval adjusting cells CF disposed with a pitch equal to the width wcf. The width wcf is the width of the dummy interval adjusting cell CE Ncf1 is set as follows:

$$Ncf1 = \text{ceil}(c2/wcf)$$

where a sign "/" indicates a division.

Data on the dummy interval adjusting cell CF disposed on the right end of the dummy interval adjusting cell group Gcf may partially overlap data on the crack extension preventing edge cell CE disposed on the left end of the second crack extension preventing edge cell group Gce2. The overlapping of data allows the semiconductor device 3 having various circuit design areas and chip sizes to facilitate local positioning of the dummy patterns DMY1 in the dummy interval adjusting cells CF that are identical in shape.

The seal ring/crack extension preventing layout generating system 8 has the following effects:

The seal ring/crack extension preventing layout generating system 8 determines the formation area of the crack extension preventing area CR based on the data range of the circuit design area 3D in the table file 8b and the distance Ct. Furthermore, the scribe line center is determined based on the distance We with respect to the formation area of the crack extension preventing area CR. Hence, the layout of the crack extension preventing area CR is easily determined. Furthermore, the formation area of the crack extension preventing area CR does not depend upon the structure of a scribe line.

The seal ring/crack extension preventing layout generating system 8 first places the crack extension preventing corner cell CC on each corner of the crack extension preventing area CR. Next, the first crack extension preventing edge cell group Gce1 and the second crack extension preventing edge cell group Gce2 are disposed next to the crack extension preventing corner cells CC placed on both ends of the outer periphery of the crack extension preventing area CR. The dummy interval adjusting cell group Gcf is then disposed between the first crack extension preventing edge cell group Gce1 and the second crack extension preventing edge cell group Gce2. Thus, the dummy patterns DMY1 are locally positioned near the centers of the chip peripheral parts 31 and so on, allowing a stress near the corners of the semiconductor device 3 to suppress a mechanical fracture of the crack extension preventing area CR.

<Semiconductor Device According to Fourth Embodiment>

Figure 23:
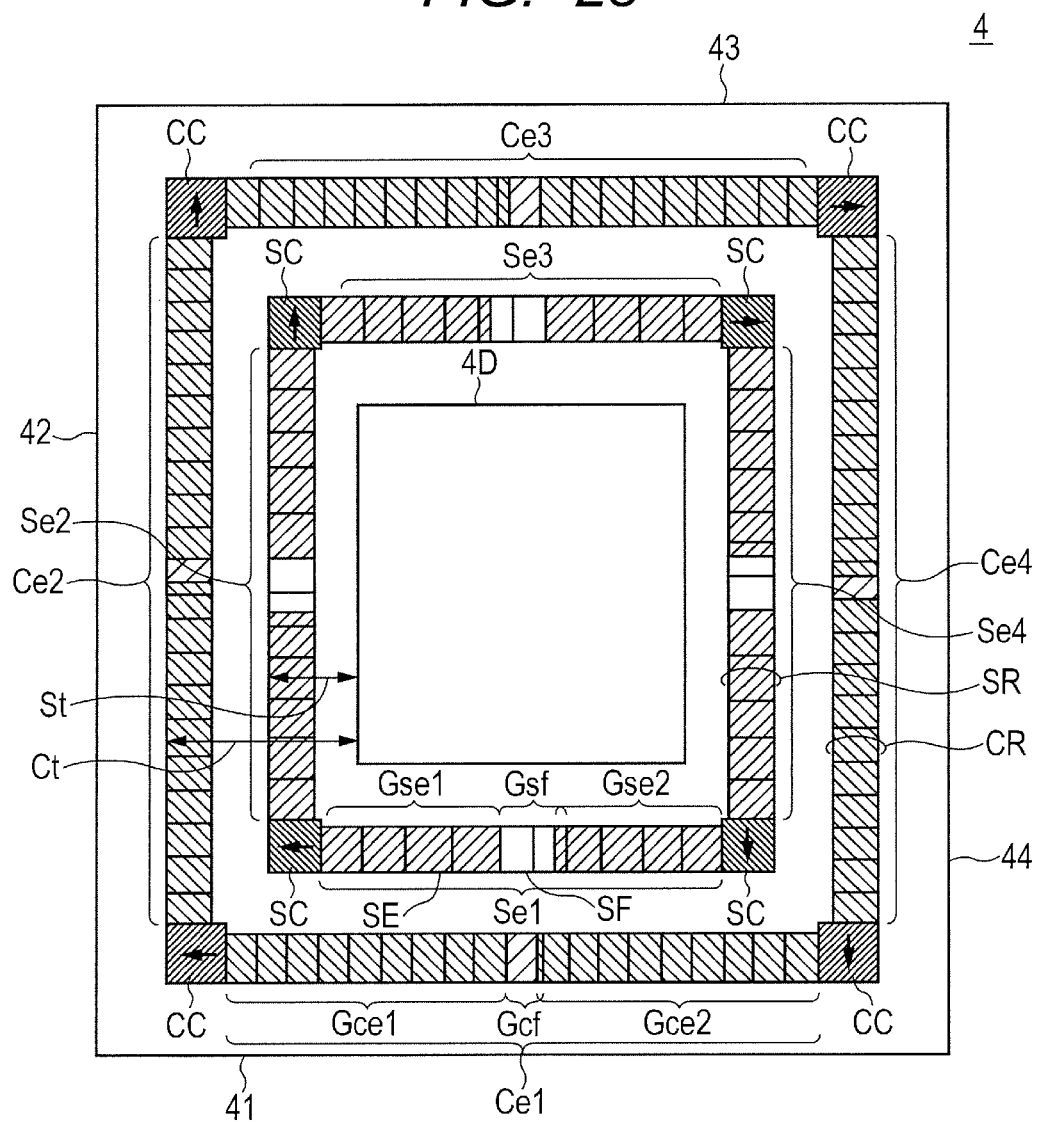
FIG. 23 is a schematic diagram of a semiconductor device according to a fourth embodiment.

Referring to FIG. 23, the configuration of a semiconductor device 4 according to the fourth embodiment will be described below.

The semiconductor device 4 according to the fourth embodiment includes a seal ring area SR formed around a circuit design area 4D and a crack extension preventing area CR. The seal ring area SR includes four seal ring corner cells SC disposed near the corners of the circuit design area 4D, and seal ring edges Se1 to Se4. The crack extension preventing area CR includes four crack extension preventing corner cells CC disposed outside of the seal ring area SR, and crack extension preventing edges Ce1 to Ce4. The seal ring area SR and the crack extension preventing area CR are identical in configuration to those of the semiconductor device 1 according to the first embodiment and the semiconductor device 3 according to the third embodiment, and thus the explanation thereof is omitted.

Figure 24:
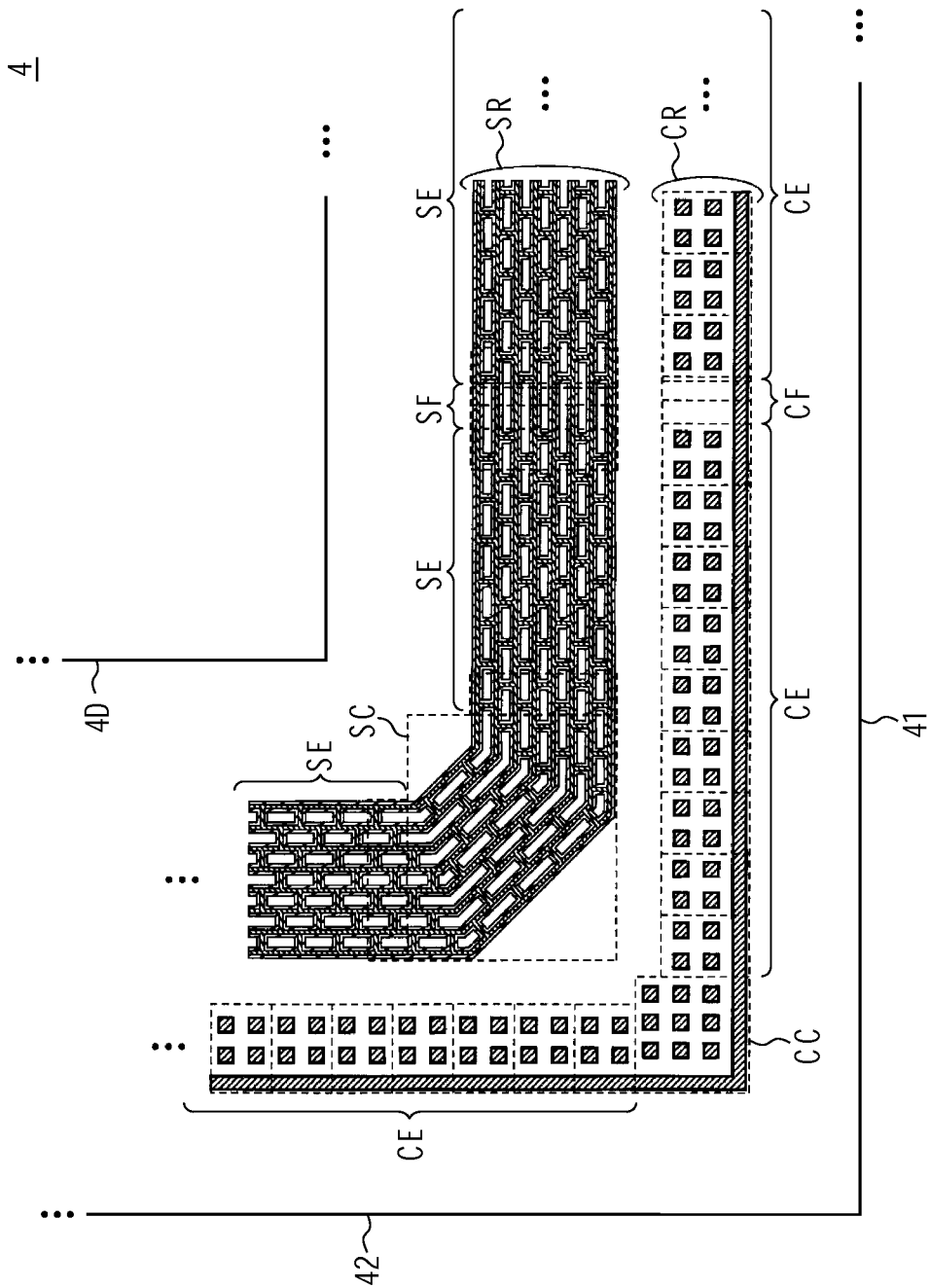
FIG. 24 is a plan view of a seal ring area and a crack extension preventing area that are provided in the semiconductor device of FIG. 23.

Referring to FIG. 24, the following will discuss a plan view of the seal ring area SR and the crack extension preventing area CR that are provided in the semiconductor device 4 according to the fourth embodiment.

FIG. 24 is a plan view in the vicinity of a chip peripheral part 41 and a chip peripheral part 42 of the semiconductor device 4 illustrated in FIG. 23. The seal ring area SR is formed around the circuit design area 4D while the crack extension preventing area CR is formed around the seal ring area SR. The seal ring area SR in FIG. 24 is identical in configuration to the seal ring area SR in FIG. 2. The crack extension preventing area CR in FIG. 24 is identical in configuration to the crack extension preventing area CR in FIG. 24.

The seal ring area SR and the crack extension preventing area CR in FIG. 23 are generated by the seal ring/crack extension preventing layout generating system 8 illustrated in FIG. 8.

The seal ring/crack extension preventing layout generating system 8 sets a distance St between the circuit design area 4D and the seal ring area SR and a distance Ct between the circuit design area 4D and the crack extension preventing area CR based on a description of a table file 8b included in read table files. Cells (SC/SE/SR and CC/CE/CF) configuring the seal ring area SR and the crack extension preventing area CR are located at positions specified by the distance St and the distance Ct.

Bridge interval adjusting cells SF and dummy interval adjusting cells CF are respectively disposed in a bridge interval adjusting cell group Gsf and a dummy interval adjusting cell group Gcf. Thus, bridge patterns br and dummy patterns DMY1 are locally relocated near the centers of the chip peripheral parts 41 and 42 and chip peripheral parts 43 and 44 of the semiconductor device 4 (see FIG. 24).

The seal ring area SR and the crack extension preventing area CR in FIG. 23 include the bridge interval adjusting cell group Gsf and the dummy interval adjusting cell group Gcf which are disposed near the centers of the chip peripheral parts 41 to 44. Hence, the bridge interval adjusting cell group Gsf and the dummy interval adjusting cell group Gcf are close to each other. The bridge interval adjusting cell group Gsf and the dummy interval adjusting cell group Gcf may be optionally shifted in opposite directions along the chip peripheral parts 41 to 44.

When the multilayer seal ring area and the multilayer crack extension preventing area are generated, the seal ring/crack extension preventing layout generating system 8 has the following effects:

The seal ring/crack extension preventing layout generating system 8 according to the embodiment determines the formation area of the seal ring area SR and the crack extension preventing area CR based on the data range of the circuit design area 4D in the table file 8b, the distance St, and the distance Ct.

The placement coordinates of all kinds of cell data (including SC/SE/SF and CC/CE/CF) configuring the seal ring area SR and the crack extension preventing area CR are determined based on the set values of the distance St and the distance Ct. In the table file 8b, information on all kinds of cell data placed in the seal ring area SR and the crack extension preventing area CR is described as seal ring data design rule blocks.

The seal ring/crack extension preventing layout generating system 8 generates the seal ring area SR and the crack extension preventing area CR, which surround the circuit design area 4D, based on the description of the table file 8b.

In the generated seal ring area SR and the generated crack extension preventing area CR, the bridge patterns br and the dummy patterns DMY1 are locally positioned near the centers of the chip peripheral parts 21 to 24. Hence, the multiple seal ring area/crack extension preventing areas can be easily designed, providing the semiconductor device with higher moisture resistance.

<Semiconductor Device According to Fifth Embodiment>

Referring to FIG. 25, the configuration of a semiconductor device 5 according to the fifth embodiment will be described below.

In the semiconductor device 1 according to the first embodiment, for example, the single bridge interval adjusting cell group Gsf is disposed near the center of the seal ring edge Se1 (FIG. 1). Similarly, in the third embodiment, for example, the single dummy interval adjusting cell group Gcf is disposed near the center of the crack extension preventing edge Ce1 (FIG. 20). In other words, in this example, the bridge patterns br and the dummy patterns DMY1 are locally positioned at a point on each of the single seal ring edge and the single crack extension preventing edge. However, the bridge patterns br and the dummy patterns DMY1 may be locally positioned at multiple points on the single seal ring edge and the single crack extension preventing edge.

FIG. 25 is a plan view of the semiconductor device 5 including a seal ring area SR or a crack extension preventing area CR around a circuit design area 5D. In the case where the seal ring area SR is formed, seal ring edges Se1 to Se4 and four seal ring corner cells SC are disposed around the circuit design area 5D. In the case where the crack extension preventing area CR is formed, crack extension preventing edges Ce1 to Ce4 and four crack extension preventing corner cells CC are formed around the circuit design area 5D.

The seal ring edge Se2/crack extension preventing edge Ce2 includes seal ring edge cell groups Gse21 to Gse23/crack extension preventing edge cell groups Gce21 to Gce23 and bridge interval adjusting cell groups Gsf21 and Gsf22/dummy interval adjusting cell groups Gcf21 and Gcf22. The seal ring edge Se4/crack extension preventing edge Ce4 is identical in configuration to the seal ring edge Se2/crack extension preventing edge Ce2.

The seal ring edge Se1 and the crack extension preventing edge Ce1 are identical in configuration to those of the semiconductor device 1 in FIG. 1 and the semiconductor device 3 in FIG. 20.

In the semiconductor device 5, the seal ring edge Se2 includes the seal ring edge cell group Gse21 disposed adjacent to the seal ring corner cell SC on the lower left corner, and the seal ring edge cell group Gse23 disposed adjacent to the seal ring corner cell SC on the upper left corner. The seal ring edge cell group Gse22 is disposed between the seal ring edge cell group Gse21 and the seal ring edge cell group Gse23.

The bridge interval adjusting cell group Gsf21 is disposed between the seal ring edge cell group Gse21 and the seal ring edge cell group Gse22 while the bridge interval adjusting cell group Gsf22 is disposed between the seal ring edge cell group Gse22 and the seal ring edge cell group Gse23. In other words, bridge patterns are locally relocated at multiple points in a scattered manner. This suppresses an increase in interval between the bridge patterns in relocation areas more than in a single relation area, improving the reliability of the seal ring area SR.

Similarly, on the crack extension preventing edge Ce2, the dummy patterns are locally relocated at multiple points in a scattered manner. This suppresses an increase in interval between the dummy patterns in relocation areas more than in a single relocation area, improving the reliability of the semiconductor device 5. In other words, the crack extension preventing area CR prevents cracks on chip peripheral parts 51 to 54 from extending into the semiconductor device 5.

<Modification of Embodiments>

The bridge patterns br provided in the semiconductor device 1 according to the first embodiment couple the multiple seal rings sr1 to sr8, contributing to an improvement in the mechanical strength of the seal ring area SR. Thus, the bridge patterns br spaced with a predetermined pitch are preferably shaped with higher mechanical strength against a stress applied to a semiconductor device chip from the seal ring extended along the chip peripheral part.

The dummy patterns DMY1 in, for example, the semiconductor device 3 according to the third embodiment are disposed to prevent cracks appearing in an interlayer insulating layer or a wiring layer from extending to the inner area of the semiconductor device. The cracks are caused by a stress applied to the chip peripheral part of the semiconductor device. With this configuration, the shapes of the dummy patterns DMY1 in plan view are not limited to squares and thus may be any shapes having a crack extension preventing function.

For example, in the semiconductor device 1 according to the first embodiment, the bridge patterns br are locally positioned by placing the bridge interval adjusting cells SF not containing the bridge patterns br (FIG. 2). In other words, the intervals between the bridge patterns br are locally increased so as to avoid the creation of the bridge patterns br that violate the design rule. The locally increased intervals may be carelessly set depending upon the design of the seal ring edge cell SE containing the bridge patterns br.

In this case, additional bridge patterns br may be disposed at larger intervals than those (the interval ds1 in FIG. 2) of an area not containing the seal ring edge cells SE, that is, a local positioning area. The additionally disposed bridge patterns br suppress a reduction in the mechanical strength of the seal ring area SR. Also in the case where the dummy patterns DMY1 are locally positioned in, for example, the semiconductor device 3 according to the third embodiment, additional dummy patterns DMY1 may be disposed at larger intervals than the intervals (the first interval dc1) of the dummy patterns DMY1.

It should be noted that the disclosed embodiments are merely exemplary from all the aspects and do not limit the present invention. The scope of the present invention is not intended to be defined by the above explanation but the scope of claims, and all changes are intended to fall within the scope of claims and the equivalent meaning and scope.

What is claimed is:

1. A semiconductor device comprising:
a semiconductor substrate including a first side extending along a first direction, a second side extending along the first direction and opposite to the first side, a third side extending along a second direction perpendicular to the first direction and a fourth side extending along the second direction and opposite to the third side;
a first seal ring formed over the semiconductor substrate and extending along the first side;
a second seal ring formed over the semiconductor substrate and extending along the first side; and
a plurality of first bridge patterns formed over the semiconductor substrate, extending along the second direction, coupled to the first and second seal rings and arranged with a first interval,
wherein the first bridge patterns include a first group arranged near the third side and a second group arranged near the fourth side than the first group, and
wherein a second interval between the first bridge pattern of the first group which is most adjacent to the second group and the first bridge pattern of the second group which is most adjacent to the first group is larger than the first interval.

2. The semiconductor device according to the claim 1, wherein the first and second intervals are center distances of the adjacent first bridge patterns, respectively.

3. The semiconductor device according to the claim 1, wherein each of the first seal ring, the second seal ring and the first bridge pattern comprises:
a first wiring formed over the semiconductor substrate;
a via formed over the first wiring and connected to the first wiring; and
a second wiring formed over the via and connected to the via.

4. The semiconductor device according to the claim 3, wherein, in a plan view, the vias extend along the first and second wirings.

5. The semiconductor device according to the claim 1, wherein the first and second seal rings are formed in a lower wiring layer,
wherein a third seal ring is formed over the first and second seal rings and is formed in an upper wiring layer which is formed over the lower wiring layer, and
wherein the first and second seal rings are connected to the third seal ring.

6. A semiconductor device comprising:
a semiconductor substrate including a first side extending along a first direction, a second side extending along the first direction and opposite to the first side, a third side extending along a second direction perpendicular to the first direction and a fourth side extending along the second direction and opposite to the third side;
a first seal ring formed over the semiconductor substrate and extending along the first side;
a second seal ring formed over the semiconductor substrate and extending along the first side; and
a plurality of first bridge patterns formed over the semiconductor substrate, extending along the second direction, coupled to the first and second seal rings and arranged with a first interval,
wherein the first bridge patterns include a first group arranged near the third side and a second group arranged near the fourth side than the first group, and
wherein a bridge interval adjusting region is arranged between the first and second groups, has a second interval which is larger than the first interval, has the first and second seal rings and has no first bridge patterns.

7. The semiconductor device according to the claim 6, wherein the first and second intervals are center distances of the adjacent first bridge patterns, respectively.

8. The semiconductor device according to the claim 6, wherein each of the first seal ring, the second seal ring and the first bridge pattern comprises:
a first wiring formed over the semiconductor substrate;
a via formed over the first wiring and connected to the first wiring; and
a second wiring formed over the via and connected to the via.

9. The semiconductor device according to the claim 8, wherein, in a plan view, the vias extend along the first and second wirings.

10. The semiconductor device according to the claim 6,
wherein the first and second seal rings are formed in a lower wiring layer,
wherein a third seal ring is formed over the first and second seal rings and is formed in an upper wiring layer which is formed over the lower wiring layer, and
wherein the first and second seal rings are connected to the third seal ring.

\* \* \* \* \*